(12) United States Patent
Prather

(10) Patent No.: US 8,155,639 B2
(45) Date of Patent: Apr. 10, 2012

(54) SYSTEM AND METHOD FOR COMPUTER NOTEBOOOK ELECTROMAGNETIC COMPATIBILITY ANALYSIS

(75) Inventor: Scott Dale Prather, Seatle, WA (US)

(73) Assignee: AT&T Mobility II LLC, Atlanta, GA (US)

( * ) Notice: Subject to any disclaimer, the term of this patent is extended or adjusted under 35 U.S.C. 154(b) by 1026 days.

(21) Appl. No.: 12/052,521

(22) Filed: Mar. 20, 2008

(65) Prior Publication Data

US 2009/0066343 A1   Mar. 12, 2009

Related U.S. Application Data

(60) Provisional application No. 60/908,020, filed on Mar. 26, 2007.

(51) Int. Cl.
| | |
|---|---|
| H04W 24/00 | (2009.01) |
| G01R 29/12 | (2006.01) |
| G01R 23/20 | (2006.01) |
| G01R 27/28 | (2006.01) |
| G01R 29/22 | (2006.01) |
| G01R 31/00 | (2006.01) |
| G01R 29/10 | (2006.01) |
| G01R 31/14 | (2006.01) |
| H05K 9/00 | (2006.01) |
| G01N 37/00 | (2006.01) |

(52) U.S. Cl. ........ 455/425; 455/423; 455/424; 324/457; 324/620; 324/628; 324/727; 324/750.27; 361/818; 343/703; 702/81; 702/83; 702/84; 702/120; 702/123

(58) Field of Classification Search .......... 455/423–425; 324/628, 750.27, 457, 727, 620; 361/818; 343/703; 702/81, 83, 84, 120, 123
See application file for complete search history.

(56) References Cited

U.S. PATENT DOCUMENTS

| 5,861,753 A * | 1/1999 | Carbonini ..................... 324/637 |
| 6,795,030 B2 | 9/2004 | Klingler |
| 6,834,380 B2 | 12/2004 | Khazei |
| 2006/0194553 A1* | 8/2006 | Ozaki et al. ................. 455/226.1 |
| 2008/0084218 A1* | 4/2008 | Hailey et al. .................. 324/627 |

FOREIGN PATENT DOCUMENTS

JP    2001-155048 A    6/2001

OTHER PUBLICATIONS

The International Bureau of WIPO, International Preliminary Report on Patentability, Sep. 29, 2008, see all.

* cited by examiner

*Primary Examiner* — Dwayne Bost
*Assistant Examiner* — Timothy Pham
(74) *Attorney, Agent, or Firm* — Moazzam & Associates, LLC

(57) ABSTRACT

A system and method for antenna analysis and electromagnetic compatibility testing in a wireless device utilizes a "parent" device that undergoes rigorous conventional testing. A "child" device having similar components may thereafter undergo abbreviated testing. Because the Total Isotropic Sensitivity of the parent device is known, testing may be performed on the child device to infer equivalence to the parent's TIS performance using the abbreviated test techniques.

24 Claims, 29 Drawing Sheets

| Parameter | Setting |
|---|---|
| Center Frequency | 881.5 MHz for 850 band, 1960 MHz for 1900 band |
| Span | 50 MHz for 850 band, 100 MHz for 1900 band |
| Reference Level | −65 dBm |
| Resolution Bandwidth | Approx. 500 kHz @ 850 MHz, Approx. 1 MHz @1900 MHz |
| Video Bandwidth | Approx. 5 MHz @ 850 MHz, Approx. 10 MHz @1900 MHz |
| Y-Axis Scale | 5 dB per division |
| Internal Preamplifier | On |
| Input Attenuation | 0 dB |
| Integration BW | 25 MHz for 850 band, 60 MHz for 1900 band |
| Averaging | Averaging On, 10 sweeps |
| Corrections | Enabled for actual cable loss, using linear interpolation between 850 and 1950 MHz |
| Data Points per | 1800 |
| Sweep | |
| Reference Line Level | −90 dBm |
| Marker Type | Noise Marker |

Fig. 2

| Airlink/Frequency | CTIA TIS (dBm) | Avg Noise (dBm/Hz) | Peak Noise (dBm/Hz) |
|---|---|---|---|
| GSM Low | −99.6 | −153 | −136 |
| GSM Mid | −100.0 | −154 | −134 |
| GSM High | −100.6 | −155 | −135 |
| UMTS Low | −101.4 | −153 | −135 |
| UMTS Mid | −101.3 | −154 | −134 |
| UMTS High | −94.8 | −155 | −135 |

*Fig. 14*

| Airlink/Frequency | CTIA TIS (dBm) | Avg Noise (dBm/Hz) | Peak Noise (dBm/Hz) |
|---|---|---|---|
| GSM Low | −98.2 | −151 | −138 |
| GSM Mid | −96.8 | −151 | −138 |
| GSM High | −97.5 | −152 | −139 |
| UMTS Low | −98.4 | −151 | −138 |
| UMTS Mid | −102.1 | −151 | −138 |
| UMTS High | −101.7 | −152 | −139 |

*Fig. 15*

| Airlink/Frequency | CTIA TIS (dBm) | Avg Noise (dBm/Hz) | Peak Noise (dBm/Hz) |
|---|---|---|---|
| GSM Low | −102.9 | −162 | −156 |
| GSM Mid | −102.8 | −162 | −155 |
| GSM High | −104.3 | −160 | −150 |
| UMTS Low | −105.5 | −162 | −156 |
| UMTS Mid | −105.7 | −162 | −155 |
| UMTS High | −106.3 | −160 | −150 |

*Fig. 16*

| Airlink/Frequency | CTIA TIS (dBm) | Avg Noise (dBm/Hz) | Peak Noise (dBm/Hz) |
|---|---|---|---|
| GSM Low | −101.0 | −158 | −148 |
| GSM Mid | −101.6 | −162 | −153 |
| GSM High | −101.5 | −165 | −158 |
| UMTS Low | −104.5 | −158 | −148 |
| UMTS Mid | −104.9 | −162 | −153 |
| UMTS High | −105.6 | −165 | −158 |

*Fig. 17*

| Airlink/Frequency | CTIA TIS | Avg Noise | Peak Noise |
|---|---|---|---|
| GSM Low | −101.1 dBm | −150 dBm/Hz | −132 dBm/Hz |
| GSM Mid | −102.0 dBm | −145 dBm/Hz | −129 dBm/Hz |
| GSM High | −101.9 dBm | −150 dBm/Hz | −132 dBm/Hz |
| UMTS Low | −105.4 dBm | −150 dBm/Hz | −131 dBm/Hz |
| UMTS Mid | −105.7 dBm | −146 dBm/Hz | −129 dBm/Hz |
| UMTS High | −104.6 dBm | −148 dBm/Hz | −131 dBm/Hz |

*Fig. 20*

| Airlink/Frequency | CTIA TIS | Avg Noise | Peak Noise |
|---|---|---|---|
| GSM Low | −101.3 dBm | −138 dBm/Hz | −127 dBm/Hz |
| GSM Mid | −98.9 dBm | −146 dBm/Hz | −135 dBm/Hz |
| GSM High | −99.5 dBm | −149 dBm/Hz | −138 dBm/Hz |
| UMTS Low | −106.5 dBm | −141 dBm/Hz | −130 dBm/Hz |
| UMTS Mid | −107.5 dBm | −146 dBm/Hz | −135 dBm/Hz |
| UMTS High | −105.9 dBm | −148 dBm/Hz | −137 dBm/Hz |

*Fig. 21*

| Airlink/ Frequency | CTIA TIS | Avg Noise | Peak Noise |
|---|---|---|---|
| GSM Low | −104.5 dBm | −162 dBm/Hz | −151 dBm/Hz |
| GSM Mid | −103.3 dBm | −160 dBm/Hz | −147 dBm/Hz |
| GSM High | −102.9 dBm | −159 dBm/Hz | −147 dBm/Hz |
| UMTS Low | −106.4 dBm | −162 dBm/Hz | −151 dBm/Hz |
| UMTS Mid | −106.7 dBm | −160 dBm/Hz | −147 dBm/Hz |
| UMTS High | −106.9 dBm | −160 dBm/Hz | −145 dBm/Hz |

*Fig. 22*

| Airlink/ Frequency | CTIA TIS | Avg Noise | Peak Noise |
|---|---|---|---|
| GSM Low | −104.3 dBm | −163 dBm/Hz | −153 dBm/Hz |
| GSM Mid | −104.7 dBm | −158 dBm/Hz | −148 dBm/Hz |
| GSM High | −104.4 dBm | −159 dBm/Hz | −149 dBm/Hz |
| UMTS Low | −103.0 dBm | −162 dBm/Hz | −154 dBm/Hz |
| UMTS Mid | −103.2 dBm | −158 dBm/Hz | −148 dBm/Hz |
| UMTS High | −104.5 dBm | −160 dBm/Hz | −151 dBm/Hz |

*Fig. 23*

| Airlink/Frequency | CTIA TIS | Avg Noise | Peak Noise |
|---|---|---|---|
| GSM Low | −103.1 dBm | −156 dBm/Hz | −138 dBm/Hz |
| GSM Mid | −103.2 dBm | −156 dBm/Hz | −140 dBm/Hz |
| GSM High | −102.4 dBm | −157 dBm/Hz | −142 dBm/Hz |
| UMTS Low | −99.8 dBm | −156 dBm/Hz | −137 dBm/Hz |
| UMTS Mid | −102.1 dBm | −156 dBm/Hz | −140 dBm/Hz |
| UMTS High | −101.2 dBm | −156 dBm/Hz | −142 dBm/Hz |

Fig. 26

| Airlink/Frequency | CTIA TIS | Avg Noise | Peak Noise |
|---|---|---|---|
| GSM Low | Not Meas. | −157 dBm/Hz | −143 dBm/Hz |
| GSM Mid | Not Meas. | −158 dBm/Hz | −147 dBm/Hz |
| GSM High | Not Meas. | −158 dBm/Hz | −145 dBm/Hz |
| UMTS Low | Not Meas. | −157 dBm/Hz | −141 dBm/Hz |
| UMTS Mid | Not Meas. | −158 dBm/Hz | −147 dBm/Hz |
| UMTS High | Not Meas. | −156 dBm/Hz | −145 dBm/Hz |

Fig. 27

| Airlink/Frequency | CTIA TIS | Avg Noise | Peak Noise |
|---|---|---|---|
| GSM Low | −104.8 dBm | −158 dBm/Hz | −146 dBm/Hz |
| GSM Mid | −103.9 dBm | −161 dBm/Hz | −151 dBm/Hz |
| GSM High | −104.1 dBm | −156 dBm/Hz | −144 dBm/Hz |
| UMTS Low | −104.5 dBm | −159 dBm/Hz | −147 dBm/Hz |
| UMTS Mid | −103.2 dBm | −161 dBm/Hz | −151 dBm/Hz |
| UMTS High | −99.6 dBm | −156 dBm/Hz | −144 dBm/Hz |

*Fig. 28*

| Airlink/Frequency | CTIA TIS | Avg Noise | Peak Noise |
|---|---|---|---|
| GSM Low | Not Meas. | −161 dBm/Hz | −149 dBm/Hz |
| GSM Mid | Not Meas. | −161 dBm/Hz | −149 dBm/Hz |
| GSM High | Not Meas. | −150 dBm/Hz | −139 dBm/Hz |
| UMTS Low | Not Meas. | −161 dBm/Hz | −150 dBm/Hz |
| UMTS Mid | Not Meas. | −161 dBm/Hz | −149 dBm/Hz |
| UMTS High | Not Meas. | −150 dBm/Hz | −139 dBm/Hz |

*Fig. 29*

| Airlink/Frequency | CTIA TIS | Avg Noise | Peak Noise |
|---|---|---|---|
| GSM Low | −103.5 dBm | −158 dBm/Hz | −146 dBm/Hz |
| GSM Mid | −97.6 dBm | −154 dBm/Hz | −139 dBm/Hz |
| GSM High | −95.5 dBm | −151 dBm/Hz | −131 dBm/Hz |
| UMTS Low | −102.5 dBm | −158 dBm/Hz | −146 dBm/Hz |
| UMTS Mid | −98.5 dBm | −154 dBm/Hz | −139 dBm/Hz |
| UMTS High | −99.4 dBm | −151 dBm/Hz | −133 dBm/Hz |

Fig. 32

| Airlink/Frequency | CTIA TIS | Avg Noise | Peak Noise |
|---|---|---|---|
| GSM Low | Not Meas. | −155 dBm/Hz | −142 dBm/Hz |
| GSM Mid | Not Meas. | −154 dBm/Hz | −143 dBm/Hz |
| GSM High | Not Meas. | −153 dBm/Hz | −138 dBm/Hz |
| UMTS Low | Not Meas. | −154 dBm/Hz | −141 dBm/Hz |
| UMTS Mid | Not Meas. | −154 dBm/Hz | −143 dBm/Hz |
| UMTS High | Not Meas. | −152 dBm/Hz | −139 dBm/Hz |

Fig. 33

| Airlink/Frequency | CTIA TIS | Avg Noise | Peak Noise |
|---|---|---|---|
| GSM Low | −101.3 dBm | −159 dBm/Hz | −148 dBm/Hz |
| GSM Mid | −102.6 dBm | −159 dBm/Hz | −149 dBm/Hz |
| GSM High | −104.5 dBm | −160 dBm/Hz | −148 dBm/Hz |
| UMTS Low | −102.5 dBm | −159 dBm/Hz | −149 dBm/Hz |
| UMTS Mid | −104.9 dBm | −159 dBm/Hz | −149 dBm/Hz |
| UMTS High | −104.8 dBm | −160 dBm/Hz | −149 dBm/Hz |

*Fig. 34*

| Airlink/Frequency | CTIA TIS | Avg Noise | Peak Noise |
|---|---|---|---|
| GSM Low | Not Meas. | −160 dBm/Hz | −145 dBm/Hz |
| GSM Mid | Not Meas. | −158 dBm/Hz | −144 dBm/Hz |
| GSM High | Not Meas. | −154 dBm/Hz | −135 dBm/Hz |
| UMTS Low | Not Meas. | −160 dBm/Hz | −144 dBm/Hz |
| UMTS Mid | Not Meas. | −158 dBm/Hz | −144 dBm/Hz |
| UMTS High | Not Meas. | −155 dBm/Hz | −135 dBm/Hz |

*Fig. 35*

SYSTEM AND METHOD FOR COMPUTER NOTEBOOOK ELECTROMAGNETIC COMPATIBILITY ANALYSIS

BACKGROUND OF THE INVENTION

1. Field of the Invention

The present invention is directed generally to quantifying the Electromagnetic Compatibility (EMC) of a notebook computing platform to be used in conjunction with a radio module operating on a wide-area wireless network.

2. Description of the Related Art

For several years, wireless carriers have been working with PCMCIA modem-card vendors to provide mobile computing platforms for their customers. While all PCMCIA cards went through industry-standardized testing to confirm antenna efficiency, there was always a question as to how well the radio modem would operate with the myriad of mobile computing platforms into which they might be installed. Needless to say, Electromagnetic Compatibility (EMC) with a radio modem was never a primary design consideration for notebook computer vendors. As a result, performance of these cards could vary widely depending upon the host computer's noise level.

In recent years, there has been a trend towards moving the radio modem from a removable PCMCIA card to an embedded module within the mobile computing platform. This embedded approach has the advantage of eliminating one variable—the unknown of which platform with be used with the radio modem (and the host platform's ability to co-exist from an EMC perspective). The embedded approach also introduced a new challenge, how to confirm EMC between each new computing platform and the module. Current approaches call for the testing of each individual device to assure proper EMC. Those skilled in the art will appreciate that this form of testing is time consuming and expensive. Accordingly, it can be appreciated that there is a significant need for a new system and method for EMC analysis that will provide the desired degree of accuracy and reduce testing time and cost. The present invention provides this, and other advantages, as will be apparent from the following detailed description and accompanying figures.

BRIEF DESCRIPTION OF THE SEVERAL VIEWS OF THE DRAWING(S)

FIG. 2 is a table illustrating settings for a spectrum analyzer selected for operation in the system of FIG. 1.

FIG. 14-17 are tables indicating test results for a first parent device and a first child device in the 850 MHz band and the 1900 MHz band.

FIGS. 20-23 are tables indicating test results for a second parent device and a second child device in the 850 MHz band and the 1900 MHz band.

FIGS. 26-29 are tables indicating test results for a third parent device and a third child device in the 850 MHz band and the 1900 MHz band.

FIGS. 32-35 are tables indicating test results for a fourth parent device and a fourth child device in the 850 MHz band and the 1900 MHz band.

DETAILED DESCRIPTION OF THE INVENTION

Figure 1:
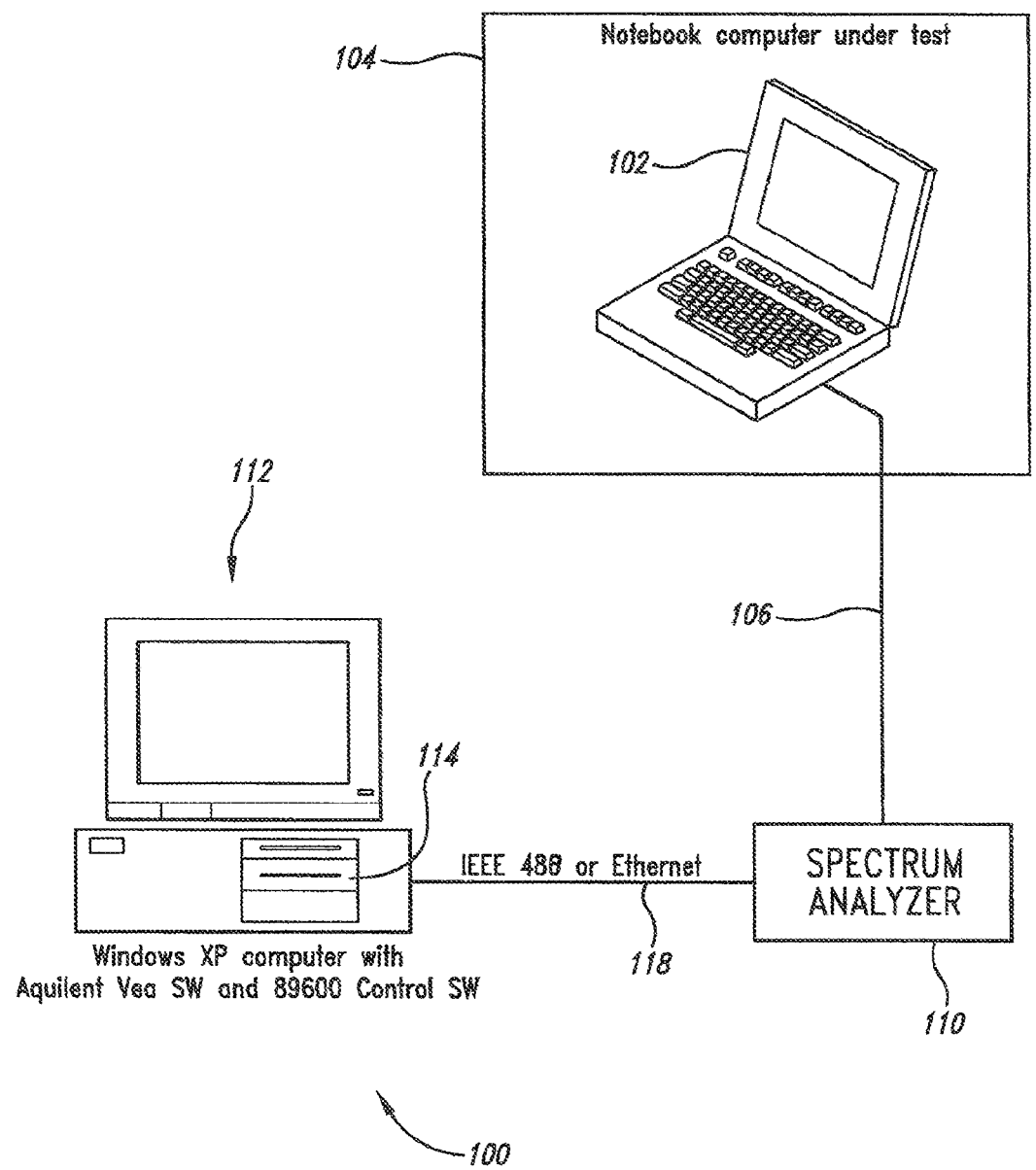
FIG. 1 is a diagram illustrating a noise signature test equipment configuration designed in accordance with the description herein.

Wireless communication devices must undergo certification testing to assure proper performance and electromagnetic compatibility (EMC).

The evaluation of computer devices with embedded modules is subject to the following:

Physical-Layer and Protocol Testing and

Radiated Performance Testing.

Typically, both of the test groups above are applied to all computing platforms. However, many computing platforms can be grouped as "families", where changes to the computing hardware may be made but the radio-related hardware and its operational aspects remain the same. In such cases, the present disclosure introduces the concept of a "Parent" and "Child" approach to testing, where the "Parent" is subject to the full gamut of applicable tests, including full total radiated power (TRP) and total isotropic sensitivity (TIS) testing and the children would be subject to a greatly-reduced test suite.

Family Definitions

In order for a given computing platform to be considered the "Child" of a fully-tested "Parent", the Child must meet the following criteria:

1. Must utilize an antenna identical to that employed in the Parent platform;
2. Must utilize the same transmission line type and length as the Parent platform;
3. Must include a ground plane to decouple the antenna from surrounding components, and this ground plane must be electrically identical between the Parent and Child; and
4. In the case of an antenna mounted inside the computing device, the dielectric and absorption characteristics of the antenna housing must be the identical to that of the Parent.

If the Child meets the criteria above, there would be no need to re-execute conformance testing of the module itself, since this component remains unchanged from the Parent platform. There would also be no need to re-execute TRP tests, since the variables associated with the antenna have been tightly controlled in the Child device relative to the Parent. The only remaining variable is TIS, which in the case of a platform that meets the "Child" criteria described above, is primarily influenced by system noise specific to the hardware utilized in the Child platform. Because of the unique nature of this noise component, we propose the introduction of a concept referred to as "noise signature", where the specific noise contributions of a Child platform are quantified and compared against the Parent.

Noise Signature Definition

Computing platforms pose a unique challenge with respect to EMC with a radio device. The close proximity of the radio antenna, coupled with a desire for the antenna to display essentially omnidirectional characteristics, makes the radio system unusually susceptible to emissions from the computing platform itself. In general, emissions from the computing platform are of minimal concern (assuming they do not exceed all applicable regulatory emissions limits) except when they fall within the downlink bands supported by the embedded radio module. For example, in the United States, emissions in the 869-894 MHz and the 1930-1990 MHz bands would be of interest. Within these bands, emissions must, in general, be well below FCC Part 15(b) limits in order to ensure EMC between the platform and the embedded module.

Because each component within the computing platform potentially contributes to the noise induced in the embedded module's antenna, each platform will display its own unique "signature", where emissions within the downlink bands can vary according to the computing hardware characteristics. The presence of computing platform noise in the downlink bands is not necessarily an impairment to radio performance. The amplitude, frequency stability and duty cycle of these emissions must be analyzed collectively in order to ascertain whether impairments noted in the "Child" device have a greater impact to receiver performance than the emissions noted in the Parent platform.

TRP/TIS Measurement

Typically new handsets, PCMCIA cards, and computing devices with embedded modules go through TRP and TIS testing as an integral part of device conformance testing and approval. The parameters TRP and TIS provide a valuable "figure of merit" for antenna performance in mobile devices.

The measurement of TRP and TIS was developed and documented by test labs, carriers, and handset manufacturers in conjunction with the Cellular Telecommunications & Internet Association (CTIA). (See CTIA *Test Plan for Mobile Station Over the Air Performance, Rev* 2.1, Cellular Telecommunications & Internet Association, 2005, which is incorporated herein by reference in its entirety.) TRP and TIS testing in a CTIA lab requires an anechoic chamber, with the device under test (DUT) situated within the chamber such that a standardized antenna can be moved in azimuth and elevation around it. Measurements are made at 15-degree increments, and the results are integrated to provide a single number (figure of merit), which represents the device's radiated power or receiver sensitivity (in dBm) relative to a sphere surrounding the DUT.

Noise Signature Measurements

Once TRP and TIS have been measured for a Parent device, the next step is to measure the Parent device's noise signature. This noise signature will be used to evaluate TIS performance of all Child devices in a family.

Noise Signature Test Equipment Configuration

The "noise signature" methodology described in this document was tested in a laboratory using conventional test equipment configured in a system 100, as shown in FIG. 1. A device under test (DUT) 102 is placed within a shielded enclosure 104. Enclosure 104 is a conventional RF shielded enclosure to protect the DUT 102 from exposure to external radiation sources during the testing procedures. In the embodiment illustrated in FIG. 1, the DUT 102 is represented as a notebook computer. Although the methodology disclosed herein may be applicable to any wireless device, it is particularly suitable to laptop or notebook computers. As described herein, the parent device and the DUT 102 have common RF circuitry, including transceiver circuitry, antennae, and the like. As such, the common circuitry should have no differences in RF performance. A wireless device, such as a cell phone or PDA typically affords the manufacturer few design choices in the selection of circuitry. In contrast, a laptop or notebook computer may often have different internal components selected by the manufacturer that may have an impact on RF performance. For example, the selection of the CPU, memory devices, graphics chip set, and the like all are manufacturing design choices. The selection of these various components may have an impact on the EMC characteristics of the DUT 102. As will be discussed in detail herein, the goal of the present methodology is to measure the impact, if any, on EMC characteristics by the change in other internal circuitry.

In the test protocol, the antenna cable is removed from an embedded RF module in the DUT 102 and the DUT 102 connected to a cable within the shielded enclosure 104. The DUT 102 is coupled by a coaxial cable 106 to a spectrum analyzer 110. In an exemplary embodiment, the coaxial cable is a 50 ohm semi-rigid coaxial cable. In an exemplary embodiment, the spectrum analyzer 110 is a conventional component. In the embodiment described herein, the spectrum analyzer 110 is an Agilent PSA spectrum analyzer. This analyzer, when using its internal preamplifier with no input attenuation, displays an unusually low noise floor of −167 dBm/Hz. This is only 7 dB above the thermal noise floor of −174 dBm/Hz, and thus supports noise measurements that may not be possible with other spectrum analyzers. However, if other conventional spectrum analyzers have equivalent performance characteristics, they may be substituted with no adverse impact on the performance of the system 100.

Operation of the spectrum analyzer 110 may be controlled using panel controls on the spectrum analyzer or, in the exemplary embodiment of FIG. 1, controlled by an external processor 112. The processor 112 may be readily implemented in the form of a conventional computer, such as a personal computer. The processor 112 includes a storage device 114, which may be in the form of a hard disk drive, optical drive, or the like. Data may also be stored on an external storage device (not shown) such as, by way of example, a data storage device on a network (i.e., a LAN or WAN).

As will be described in greater detail below, the processor 112 controls operation of the spectrum analyzer 110 via a control cable 118. In a typical implementation, the control cable 118 may be an ethernet cable or a general purpose interface cable, such as defined by IEEE 488. In an exemplary embodiment, the processor 112 may execute software provided by the spectrum analyzer manufacturer. For example, the Agilent spectrum analyzer provides analysis and control software for use on the processor 112. The processor 112 may receive and store data generated by the spectrum analyzer 110 and further provide analysis in the form of comparison of tests between the parent device and the DUT 102. Further implementation details of the processor 112 are within the scope of knowledge of one of ordinary skill In the art and need not be discussed in greater detail herein.

The Agilent model PSA spectrum analyzer was configured as shown the table of FIG. 2. Those skilled in the art will appreciate that the specific settings described herein are settings used with the Agilent PSA spectrum analyzer. If a different device were used for the spectrum analyzer 110 in FIG. 1, the operational settings would be adjusted appropriately. Operation of the spectrum analyzer 110 and the selection of appropriate operational settings are within the scope of knowledge of one ordinarily skilled in the art and need not be described in greater detail herein.

Figure 3:
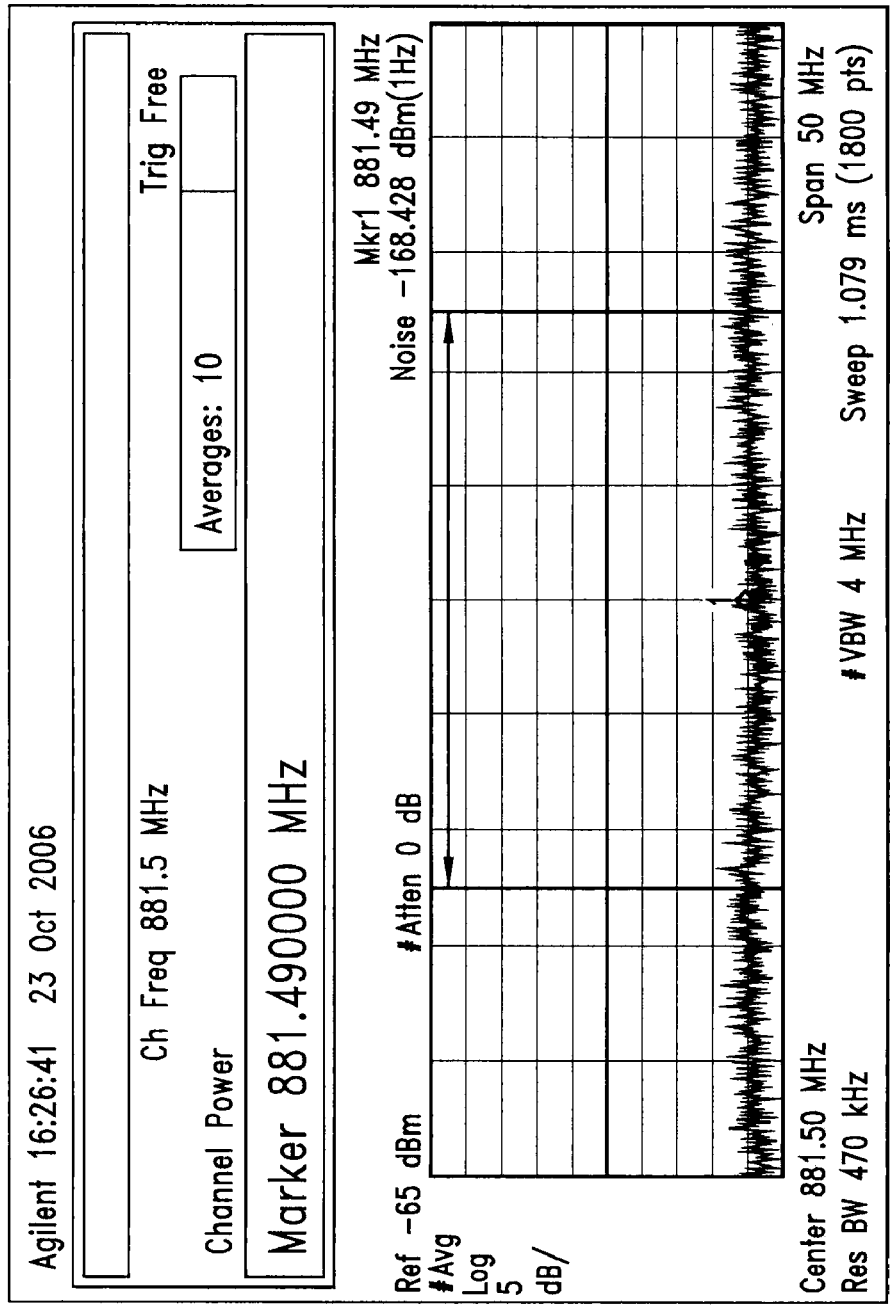
FIG. 3 is an image display of the output of the spectrum analyzer of FIG. 1 illustrating the ambient noise floor in the 850 MHz band.
Figure 4:
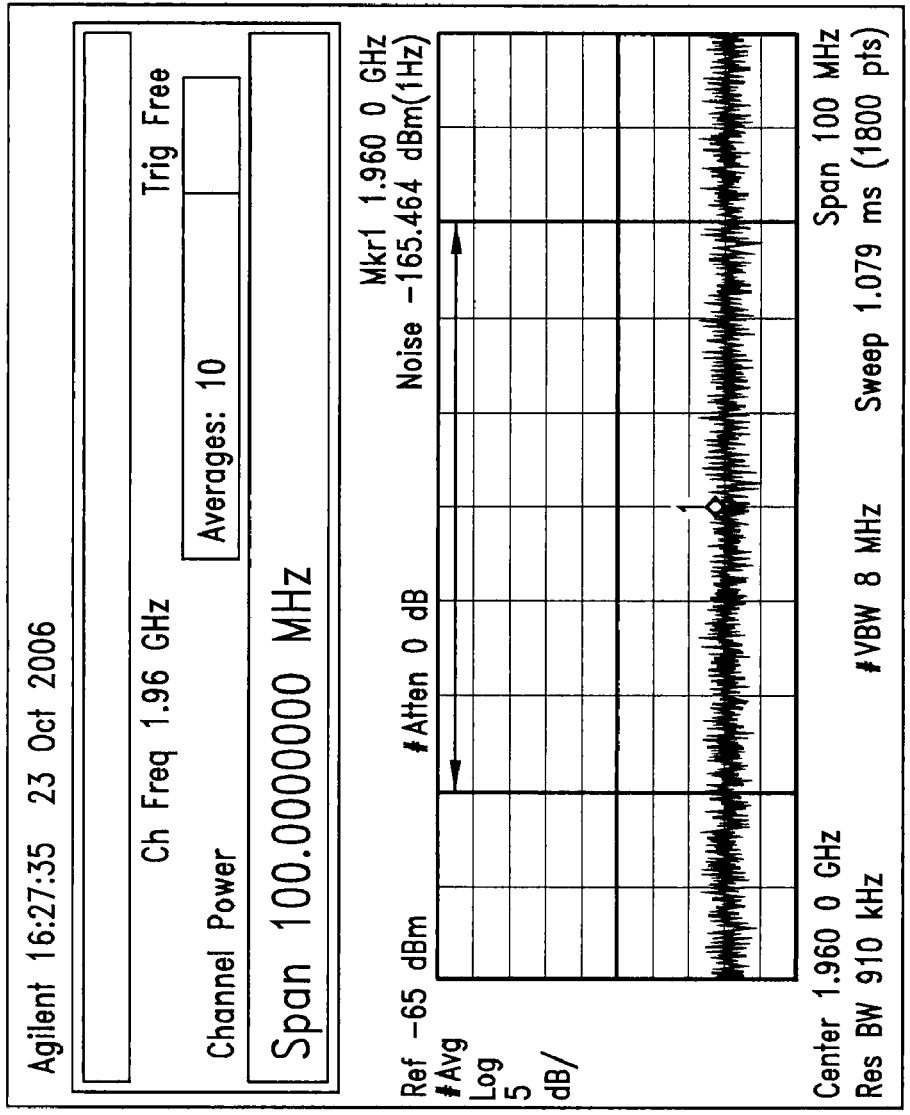
FIG. 4 is an image display of the output of the spectrum analyzer of FIG. 1 illustrating the ambient noise floor in the 1900 MHz band.

Because of the low noise figure of the PSA, it's also important that the DUT 102 be well isolated from the ambient RF environment. A Lindgren desktop chamber, which is a commercially available product, may be used to implement the shielded enclosure 104 and thus isolate the DUT 102. In the test lab, as described above, the coaxial cable 106 is a ¼" semi-rigid cable that is connected between the DUT 102 in the shielded enclosure 104 and the spectrum analyzer 110. The ambient noise level of this configuration was established with the chamber door closed and the DUT 102 turned off. The ambient noise level in the 850 MHz band is depicted in FIG. 3, and the ambient noise level in the 1900 MHz band is depicted in FIG. 4. The "band" illustrated in the spectral displays from the spectrum analyzer 110 are delineated by vertical lines on the display with a horizontal arrow extending therebetween at the top of the display.

Noise Signature Measurement Procedure

The measurement of "noise signature" is relatively simple. In an exemplary embodiment, a noise signature measurement is conducted with the spectrum analyzer 110 configured according to the table of FIG. 2 and the DUT 102 connected inside the shielded enclosure 104 as illustrated in FIG. 1. Once connected, conventional calibration procedures should be followed to measure and compensate for RF cable loss.

The most difficult aspect of conducting this test may be, in some cases, connecting the spectrum analyzer 110 to the internal antenna cable. This is especially true if the DUT 102 is a laptop computer, which may contain internal RF circuitry and antenna (not shown). To facilitate this measurement, the computer manufacturer should supply a special RF cable with the requisite connector for mating with the internal antenna cable.

In addition to supplying a "pigtail" for connection to the internal antenna cable, the computer manufacturer should also provide guidance as to how to route this cable out of the computer housing to retain integrity of electromagnetic interference (EMI) shielding.

Once the antenna cable has been put into place, the DUT 102 is booted up normally. Upon completion of the boot procedure, the tester can start a process or application that will exercise the platform, such as playing a DVD or running a computationally-intensive program such as a fractal generator. At this point, the DUT 102 may be placed into the shielded chamber 104 and connected to the spectrum analyzer 110.

Beginning in the 850 MHz band with the spectrum analyzer configured according to the table of FIG. 2, measure the time-invariant noise level (in dBm/Hz) of the DUT 102. This measurement consists of the following five measurement points:

Noise Marker 200 kHz above bottom band edge (GSM Low);
Noise Marker 2.5 MHz above bottom band edge (UMTS Low);
Noise Marker at band center (GSM and UMTS Mid);
Noise Marker 2.5 MHz below top band edge (UMTS High); and
Noise Marker 200 kHz below top band edge (GSM High).

In addition to capturing the textual data associated with these five points on the averaged trace, a screen capture can be obtained as well.

Once the 850 MHz averaged-trace (non-temporal) data has been obtained and documented, obtain the following:

Time-variant peak noise measurements (using max-hold) in the 850 MHz band at frequencies described above;
Average noise measurements in the 1900 MHz band; and
Peak noise measurements in the 1900 MHz band.

Interpretation of Noise Signature Test Results

The process for evaluating the data collected using this procedure may now be described.

Non-Temporal Noise Signature Measurements

The measurement and analysis of non-temporal emissions is used to determine what portion(s) of a wireless band will be impacted by an essentially steady-state noise source. The bandwidth and amplitude of these time-invariant interference sources can, in some cases, seriously compromise receiver performance by raising the noise floor well above the reference sensitivity of the embedded module.

Non-Temporal Noise Signature Test Results

Figure 5:
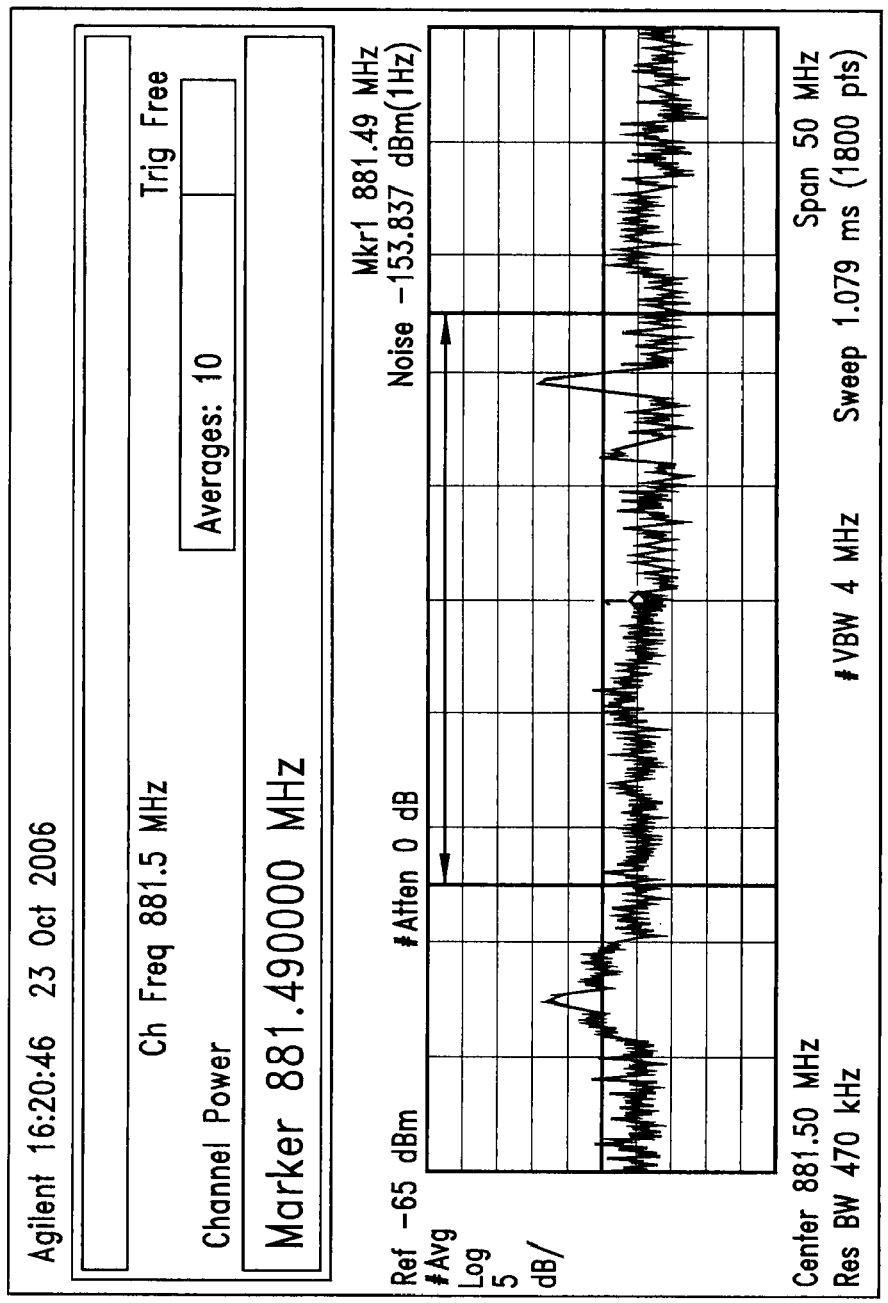
FIG. 5 is an image display of the output of the spectrum analyzer of FIG. 1 illustrating a non-temporal noise signature for a parent device in the 850 MHz band.
Figure 6:
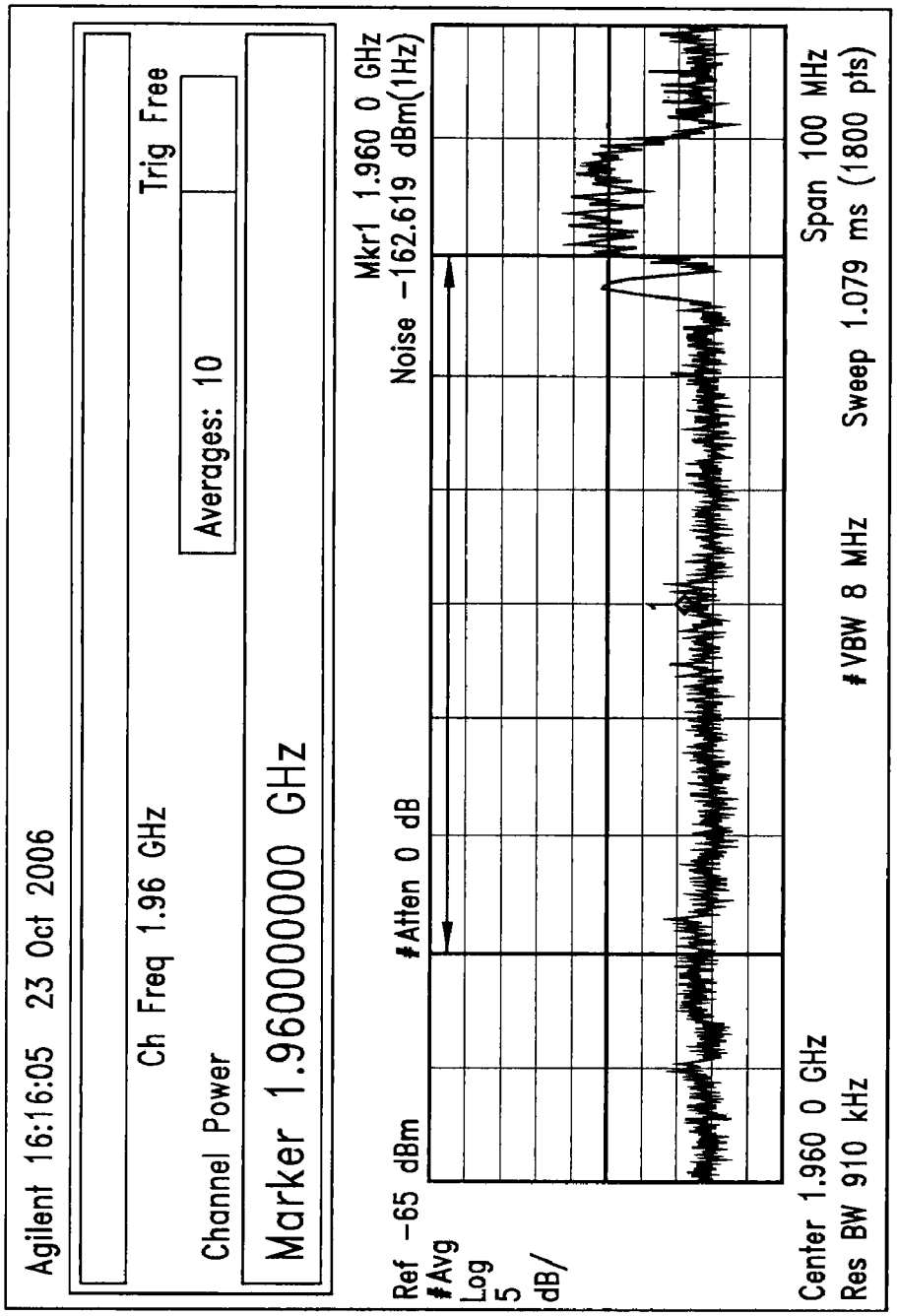
FIG. 6 is an image display of the output of the spectrum analyzer of FIG. 1 illustrating a non-temporal noise signature for a parent device in the 1900 MHz band.

Using the methodology described above, the non-temporal noise signature of a "Parent" computing platform is measured. During these tests, the busses, graphics card, etc. are exercised through an operation described above, such as the playback of a DVD. The resulting non-temporal noise signatures of the Parent DUT 102 for the 850 and 1900 MHz band are depicted in FIGS. 5 and 6, respectively.

In the 850 MHz band (see FIG. 5), the Parent DUT 102 notebook displays two prominent narrowband interferers, one about 3 MHz below the upper band edge and the other about 7 MHz below the upper band edge. The noise floor is considerably higher on the 850 MHz band, measuring about −150 dBm/Hz integrated across the full 25 MHz of this band.

Note that, especially in the 1900 MHz band (see FIG. 6), the Parent DUT 102 shows careful attention to EMC with a GSM/UMTS embedded device. This is evidenced by an overall noise level that's only 4 dB above the spectrum analyzer's front-end noise. The most predominant time-invariant interference source appears just outside the upper band edge, with a single prominent narrowband emission about 3 MHz below the upper band edge.

The overall noise floor is less than −161 dBm/Hz across the full 60 MHz integration bandwidth defined for this band. This represents a very low system noise level.

Time-Variant Noise Signature Measurements

The non-temporal noise signature measurements described in the previous section are useful from the standpoint of determining whether or not the DUT 102 displays what appear to be continuous noise or interference sources. However, to better determine the effects of time-variant noise sources (as is typically the case in computer equipment as busses are utilized), the spectrum analyzer's "max hold" function was employed. Max hold captures peak power values measured at any point in the trace during the capture period.

Figure 7:
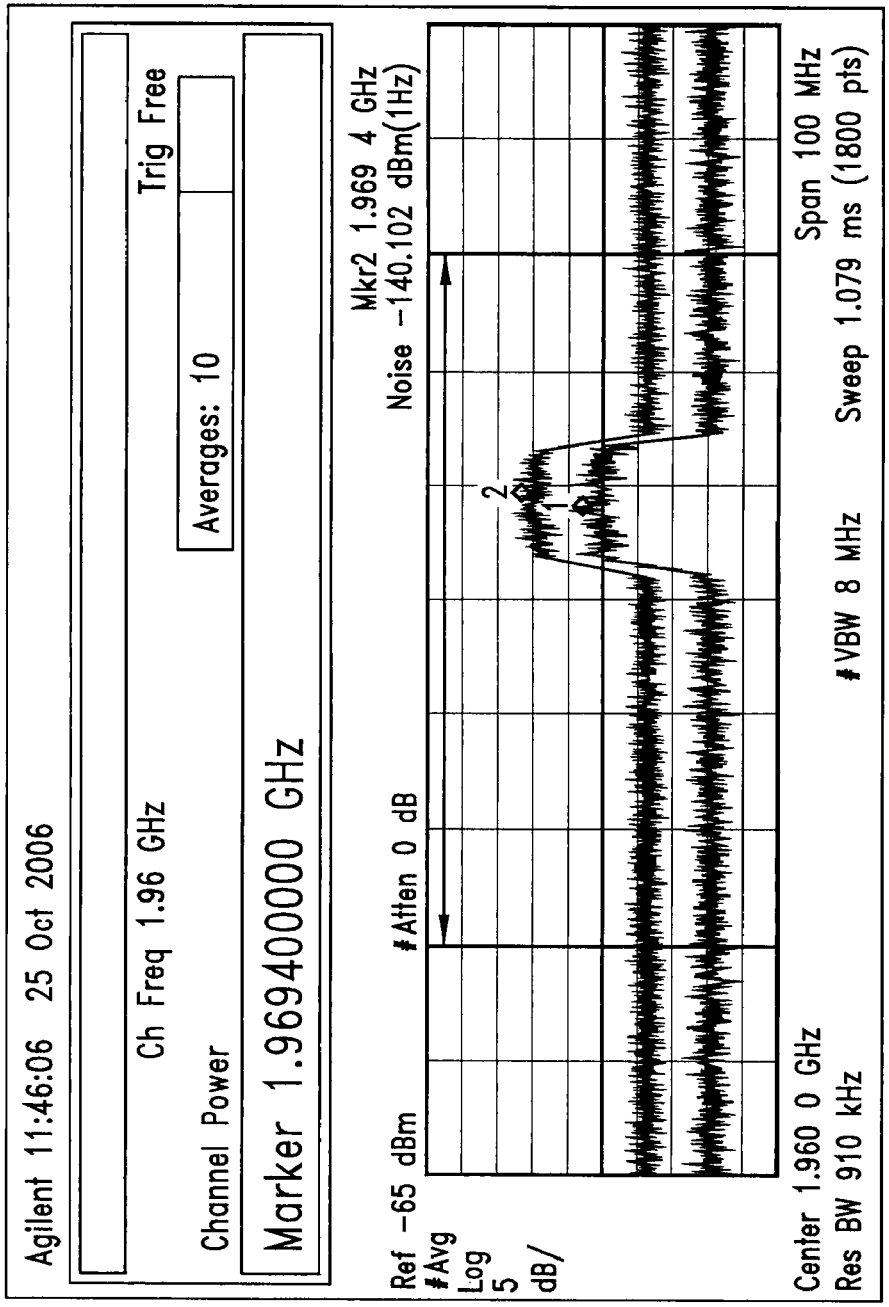
FIG. 7 is an image display of the output of the spectrum analyzer of FIG. 1 illustrating a max-hold trace with an AWGN and pseudo-random noise in the 1900 MHz band.

An example of the max hold capability is depicted in FIG. 7. Here, the lower trace represents the spectrum analyzer's internally-generated noise up to about 1967 MHz, where we see a 7 MHz-wide random noise signal generated by an H/P 89441 Vector Signal Analyzer. The top trace represents the max-hold values for the average trace. Note that both true random noise and pseudo-random noise display a delta between traces of just under 10 dB, which corresponds to the approximate peak/average ratio of a noise signal with a Gaussian power distribution. This 10 dB offset will be used in our analysis to determine what type of interferers are present within the downlink RF bands supported by the embedded module in the DUT 102.

With test equipment configured according to the example embodiment of FIG. 1 and the spectrum analyzer 110 set to the exemplary setting in the table of FIG. 2, the PSA spectrum analyzer was set up to display average power on trace #1 (top trace) and max hold values on trace #2 (lower trace). The results of these measurements against the Parent platform appear in FIGS. 8 and 9 for the 850 MHz band and the 1900 MHz band, respectively.

Time-Variant Noise Signature Analysis

Figure 8:
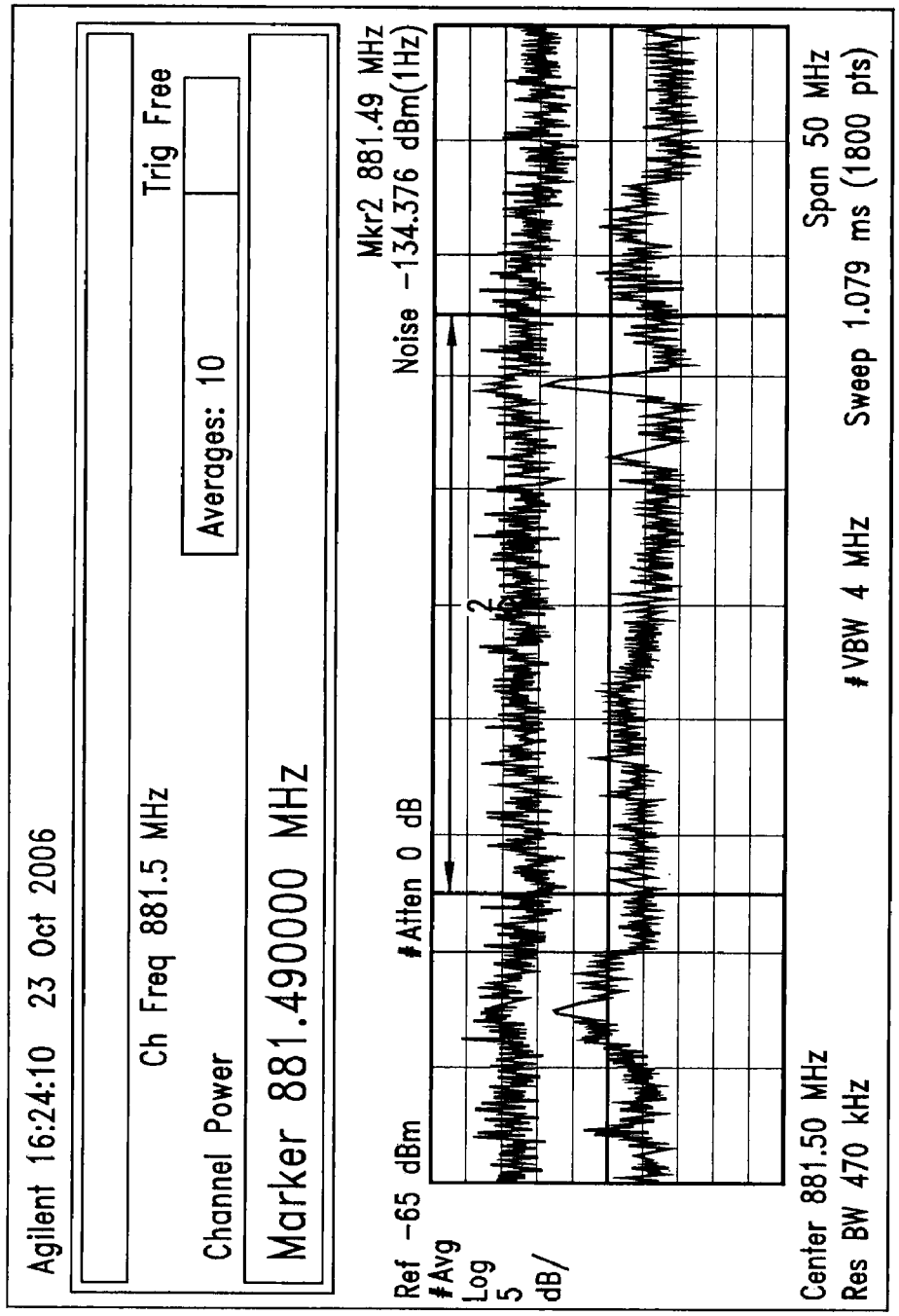
FIG. 8 is an image display of the output of the spectrum analyzer of FIG. 1 illustrating a time-variant noise signature of a parent device in the 850 MHz band.
Figure 9:
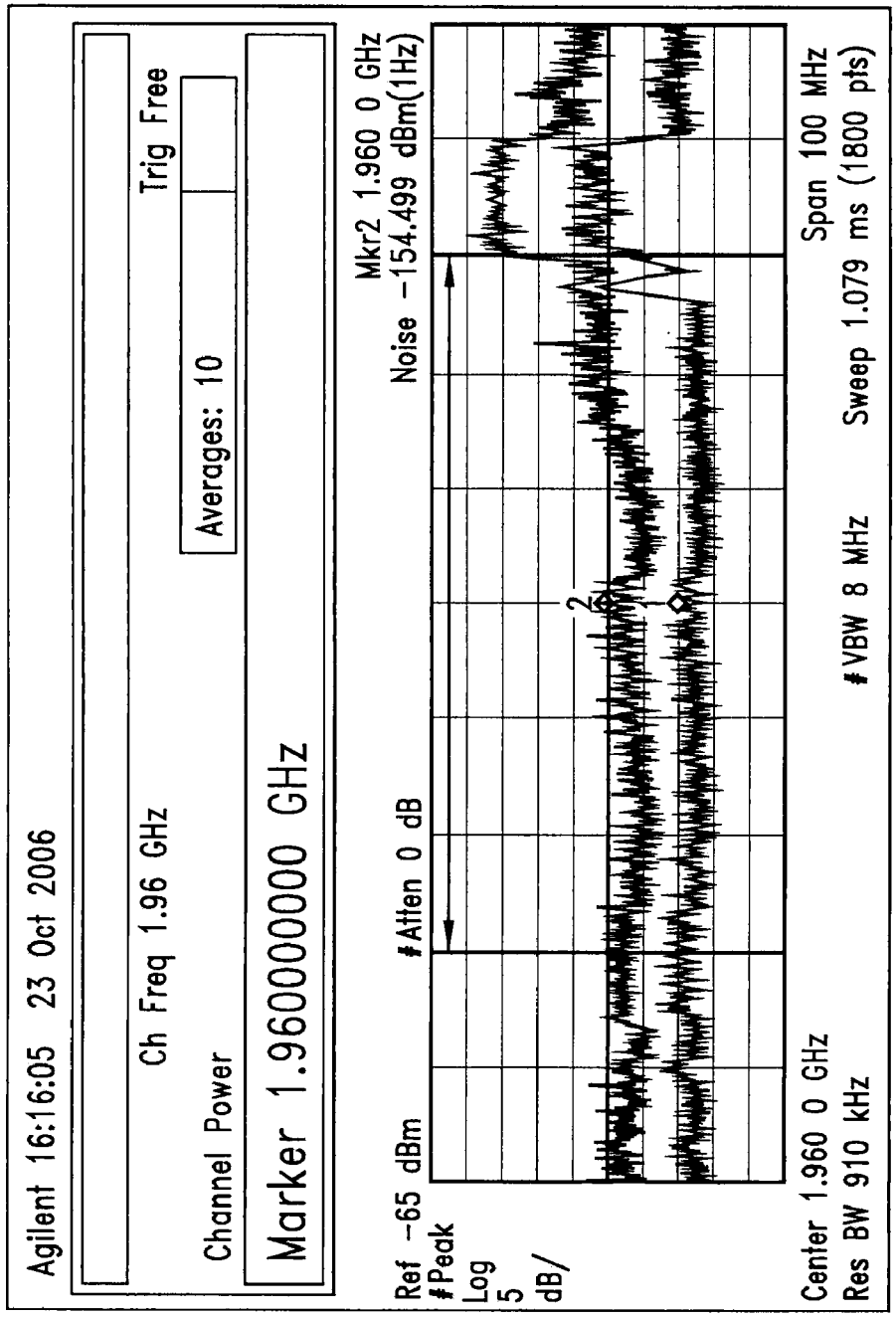
FIG. 9 is an image display of the output of the spectrum analyzer of FIG. 1 illustrating a time-variant noise signature of a parent device in the 1900 MHz band.

Interpretation of the traces captured in FIGS. 8 and 9 to identify time-variant noise sources may now be discussed.

The spectrum analyzer's "max-hold" function captures the maximum amplitude of any signal being observed. If the signal under observation is CW, the max-hold trace and the averaging trace will match. However, if the input signal is anything other than CW, max hold values will always be several dB above the averaged signal because of the peak to average ratio of the input stimulus. In the case of Gaussian noise, the peak/average ratio is about 10 dB. Since most noise signals generated by a computer display a power distribution with a peak to average ratio that often differs from Gaussian noise, we can identify where measurements are noise-limited by the instrument and where the DUT is contributing noise.

Figure 10:
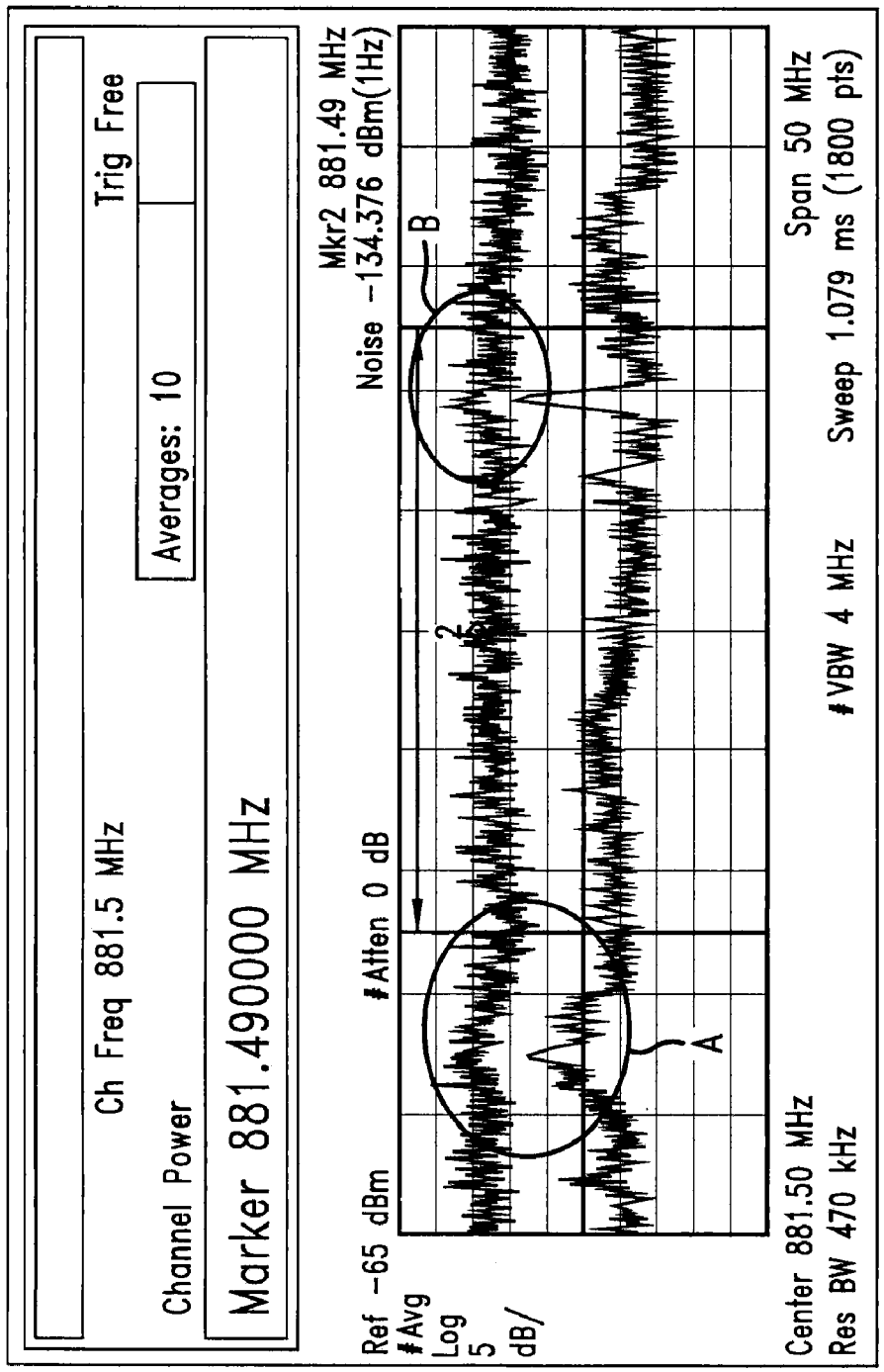
FIG. 10 is an image display of the output of the spectrum analyzer of FIG. 1 illustrating an interpretation of time-variant traces of the parent device in the 850 MHz band.

FIG. 10 illustrates the identification of time-variant noise in the 850 MHz band for the Parent device. Referring to this figure, label "A" indicates an portion of the max-hold trace where the power delta between the average trace and the max-hold trace is almost 10 dB. Consequently, we can conclude that the signal at "A" is a wideband source with a power distribution that is nearly Gaussian in nature, but the max-hold trace indicates that its frequency varies over time with a decided peak. Referring to label "B" in FIG. 10, this portion of the trace clearly indicates this emission is nearly CW, as the max-hold trace differs from the averaging trace by less than 5 dB. Note that even though the averaging trace shows a noise level that varies in excess of 6 dB across the band, the max-hold trace shows that system noise is almost constant amplitude across the band. The delta between the averaging trace and the max-hold trace is around 18 dB, indicating the presence of time-variant, high-amplitude noise transients across the band.

Figure 11:
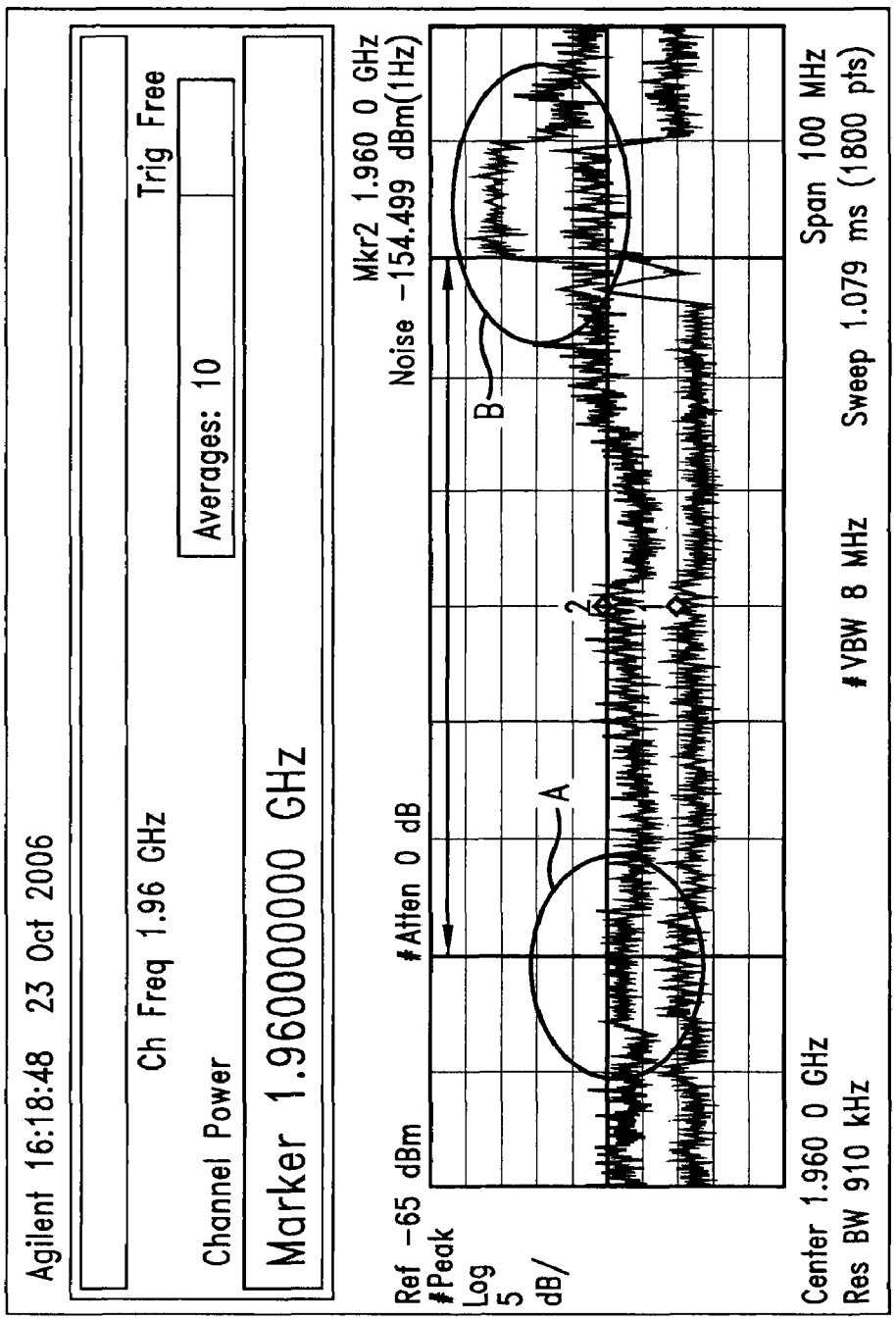
FIG. 11 is an image display of the output of the spectrum analyzer of FIG. 1 illustrating an interpretation of time-variant traces of the parent device in the 1900 MHz band.

Let's turn now to the spectrum analyzer results in the 1900 MHz band for this Parent device. Referring to FIG. 11, note that the two traces display an almost constant offset of approximately 10 dB, indicating that interference within most of the 1900 MHz band is nearly Gaussian in nature. Near the bottom edge of the 1900 MHz band, the averaging trace displays a seemingly-benign noise signal at label "A" that actually creates a very deterministic (but low amplitude) noise source as viewed in the max-hold trace. Label "B" points out two very strong interferers, a very prominent wideband interferer that appears just outside of the 1900 MHz band, and a CW signal about 3 MHz below the top edge of the band. Note that the CW signal in "B" displays appears to shift its frequency over time, as shown in the max hold trace. However, this CW signal also appears to spend a somewhat high percentage of its time about 3 MHz below the upper band edge.

Application of Noise Signature Measurement to Evaluation of Parent/Child Devices Having collected and analyzed baseline noise signature data for the "Parent" device, we'll turn now to application of this methodology to "Child" devices.

Noise Signature Test Methodology, Child Devices

Unlike the previous detailed section pertaining to noise measurement in a Parent device, only combined average and max-hold traces will be evaluated going forward. This approach reduces the number of steps required for noise signature analysis.

Figure 12:
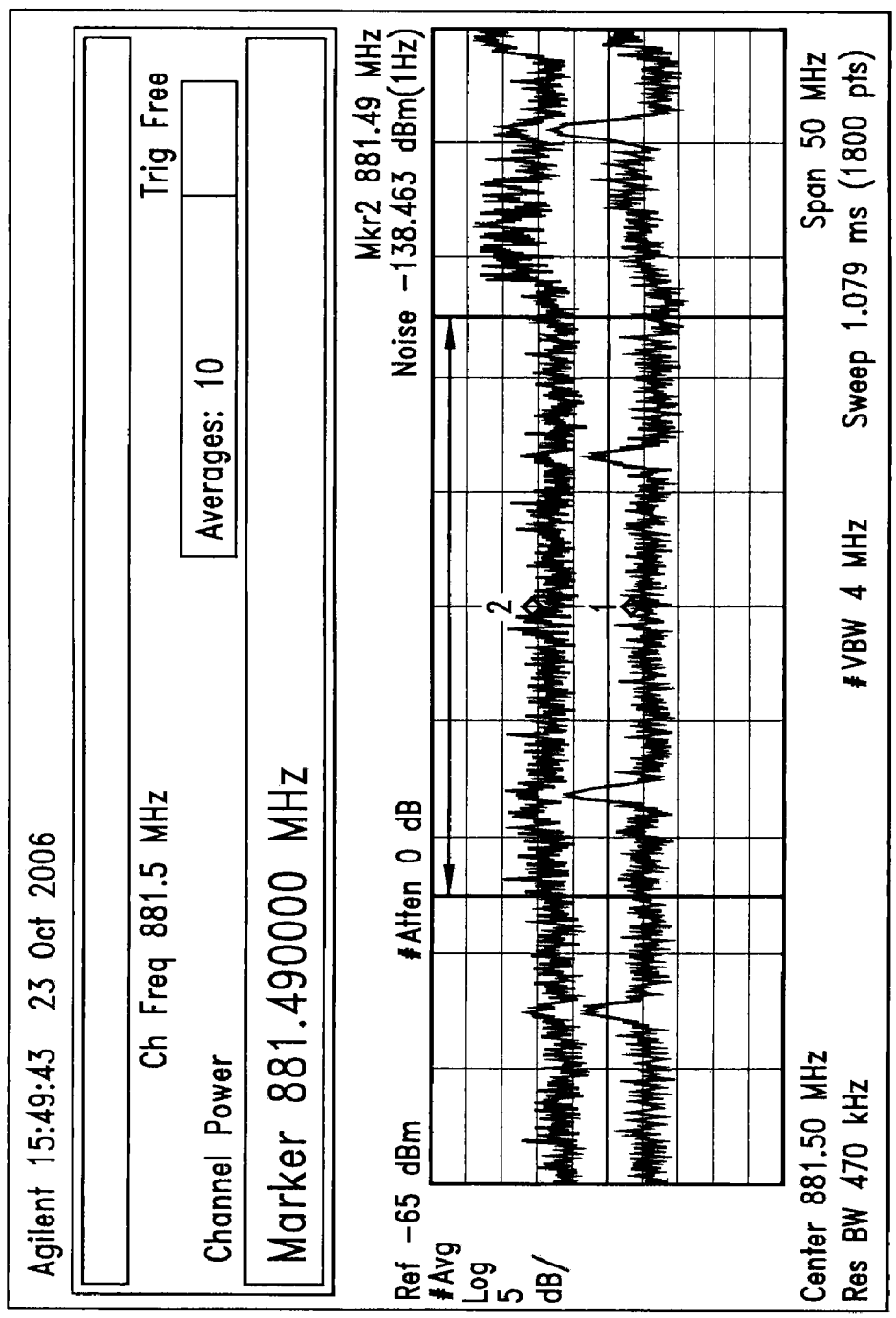
FIG. 12 is an image display of the output of the spectrum analyzer of FIG. 1 illustrating a noise signature for a first child test device in the 850 MHz band.
Figure 13:
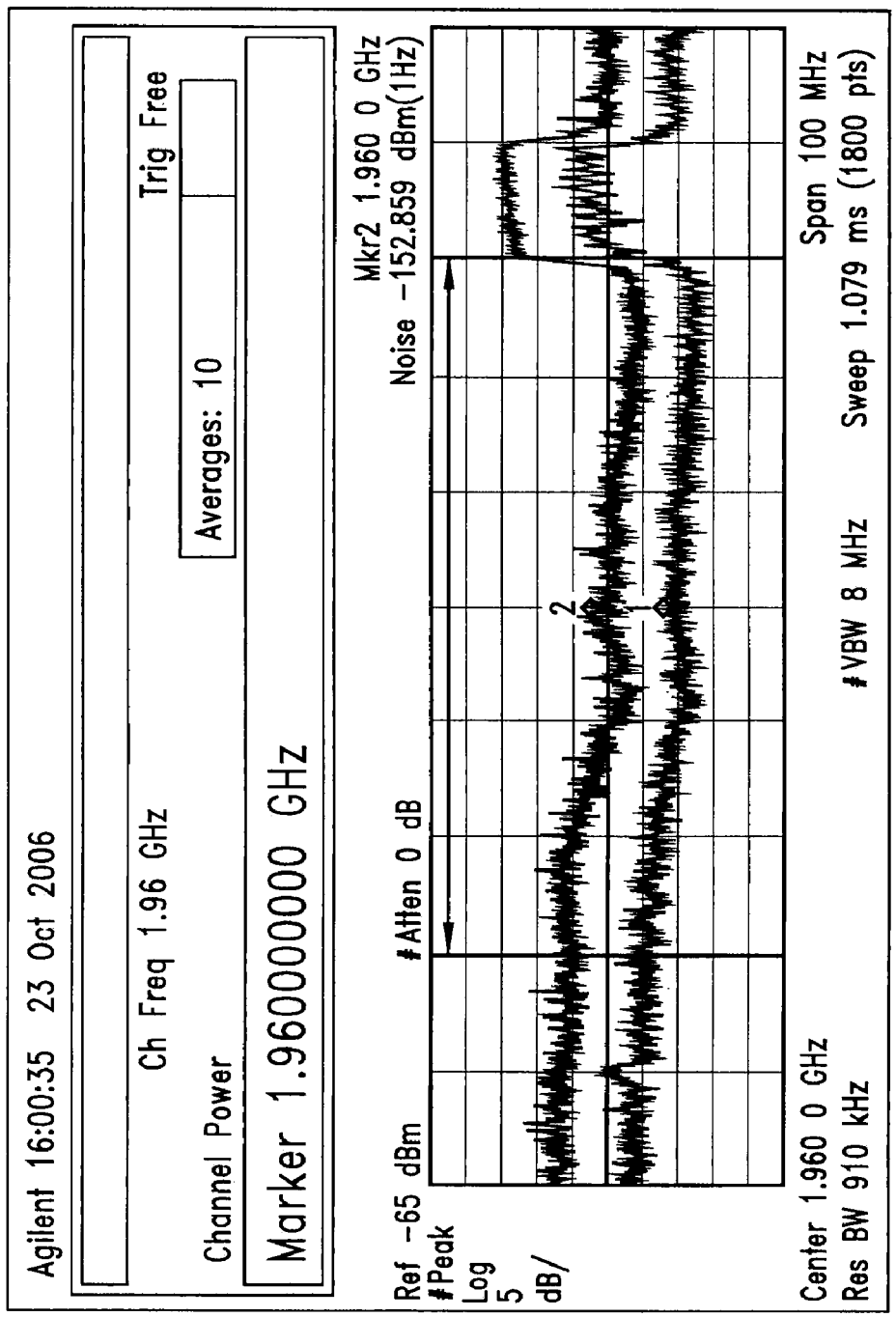
FIG. 13 is an image display of the output of the spectrum analyzer of FIG. 1 illustrating a noise signature for a first child test device in the 1900 MHz band.

We began by establishing the noise signature of a Child device to the Parent utilized in the process described above. Like the Parent, the "Child" computer utilizes a commercially-available GSM/UMTS module and dual-band antenna mounted in the notebook lid behind the display. The Child device was identical to the Parent device in every respect except for the graphics card. All cabling described in the previous Parent section was employed for the Child device as well. The noise signatures for Child device #1 are depicted in FIG. 12 for the 800 MHz band and FIG. 13 for the 1900 MHz band.

Child Device #1 Measurement Analysis

In the 850 MHz band, the Child device #1 (i.e., the DUT 102 in FIG. 1) displays two prominent narrowband interferers, one about 4 MHz above the lower band edge and the other about 8 MHz below the upper band edge. The noise floor measures about −151 dBm/Hz integrated across the full 25 MHz of this band, vs. −149 dBm/Hz on the Parent device.

In the 1900 MHz band, any predominant non-temporal interference sources appear just outside the band edges. There is a trend towards an increase in the noise floor between the center of the 1900 MHz band and the lower edge (a difference of about 5 dB) and the overall noise floor is less than −159 dBm/Hz across the full 60 MHz integration bandwidth defined for this band.

Comparison and Interpretation of Parent/Child Noise Signature Data Across Multiple Platforms Comparison of Parent/Child Performance, Case #1

The first two mobile computing platforms tested were selected for minimal variables. In this case, the Parent and Child are identical with the exception of the graphics chipset contained within the devices.

Two samples of each platform were provided by the vendor for testing. One sample of each was provided to the CTIA TIS lab, while another sample of each was provided for noise signature measurements. The samples sent to CTIA TIS labs were provided earlier in time than the samples used for noise signature measurements. Consequently it is conceivable that the device tested for CTIA TIS may not display exactly the same noise signature as the device tested in this document.

Test Results

Test results for the Parent "A" and Child "1A" are presented the tables of FIGS. 14-17. The table of FIG. 14 illustrates the test results for the Parent "A" in the 850 MHz band. The table of FIG. 15 illustrates the test results for the Child "1A" in the 850 MHz band. The table of FIG. 16 illustrates the test results for the Parent "A" in the 1900 MHz band. The table of FIG. 17 illustrates the test results for the Child "1A" in the 1900 MHz band.

Analysis

Figure 19:
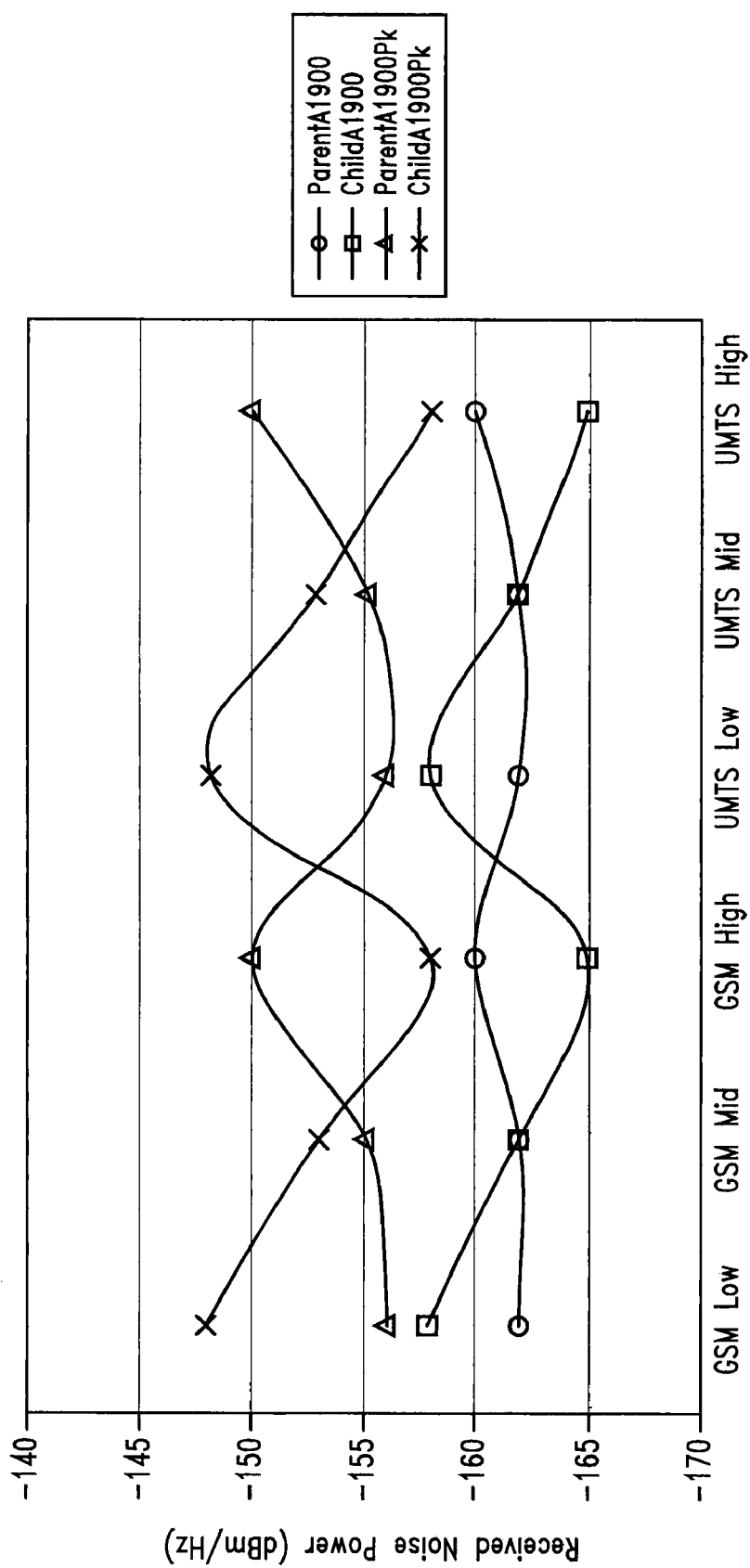
FIG. 19 is a graph illustrating received noise power comparison for a first parent device and a first child device in the 1900 MHz band.

The data from Parent "A"/Child "1A" has been graphically summarized for analysis in FIG. 19 for the 850 MHz band and in FIG. 19 for the 1900 MHz band.

Analysis, Parent A vs. Child 1A, 850 MHz Band

Figure 18:
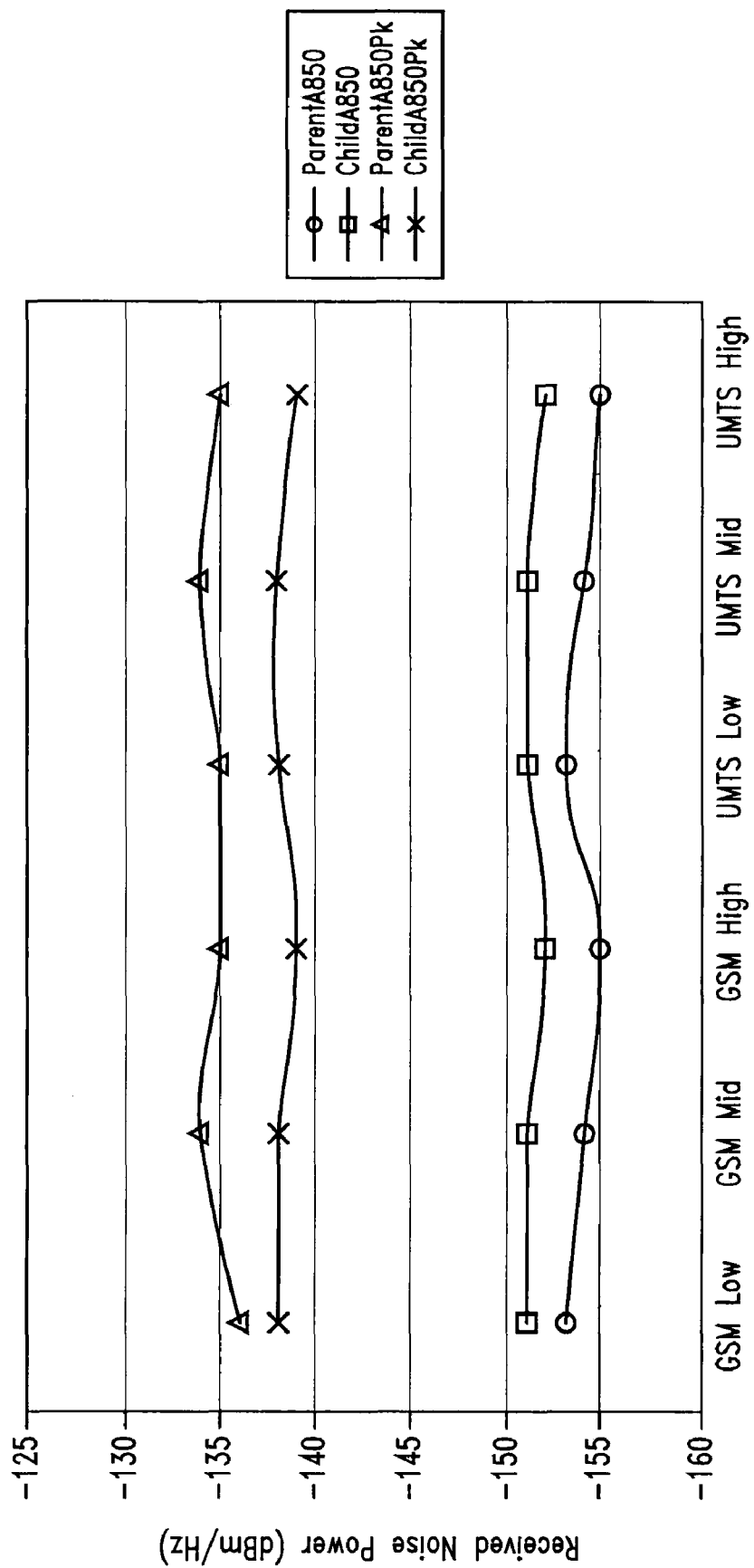
FIG. 18 is a graph illustrating received noise power comparison for a first parent device and a first child device in the 850 MHz band.

Performance of the Parent "A" device and the Child "1A" device in the 850 MHz band is presented in the tables of FIGS. 14 and 15, respectively, and graphically summarized in FIG. 18.

Beginning with Parent "A", the trends in the tables of FIGS. 14 and 15 and the graph of FIG. 18 illustrate that the peak/average ratio (PAR) between the average and peak traces is about 15 dB, which indicates the presence of time-variant noise peaks that are about 5 dB above the Gaussian noise. Both Parent "A" and Child "1A" display a very constant noise distribution across the band, and very good correlation between the average and peak power curves.

Analysis, Parent A vs. Child 1A, 1900 MHz Band

Performance of the Parent "A" device and the Child "1A" device in the 1900 MHz band is presented in the tables of FIGS. 16 and 17, respectively, and graphically summarized in FIG. 19.

In the 1900 MHz band, there is a weak correlation between the CTIA TIS and the respective DUT's noise signature. The noise signature of the Parent "A" and Child "1A" are not well correlated. The data is interesting in that it displays an almost constant PAR of 10 dB for both the Parent "A" and Child "1A", indicating a Gaussian noise contribution. Both the Parent "A" and Child "1A" devices display an unusually low noise level in the 1900 MHz band, so this variance in Gaussian noise should have almost no effect on performance.

Comparison of Parent/Child Performance, Case #2

The second two mobile computing platforms tested were also selected for minimal variables. In this case, the Parent and Child devices are identical with the exception of the screen size. Two samples of each platform were provided by the vendor for testing. One sample of each was provided to the CTIA TIS lab, while another sample of each was provided for noise signature measurements.

Test Results

Test results for the Parent "B" and Child "1B" are presented the tables of FIGS. 20-23. The table of FIG. 20 illustrates the test results for the Parent "B" in the 850 MHz band. The table of FIG. 21 illustrates the test results for the Child "1B" in the 850 MHz band. The table of FIG. 22 illustrates the test results for the Parent "B" in the 1900 MHz band. The table of FIG. 23 illustrates the test results for the Child "1B" in the 1900 MHz band.

Analysis

Figure 24:
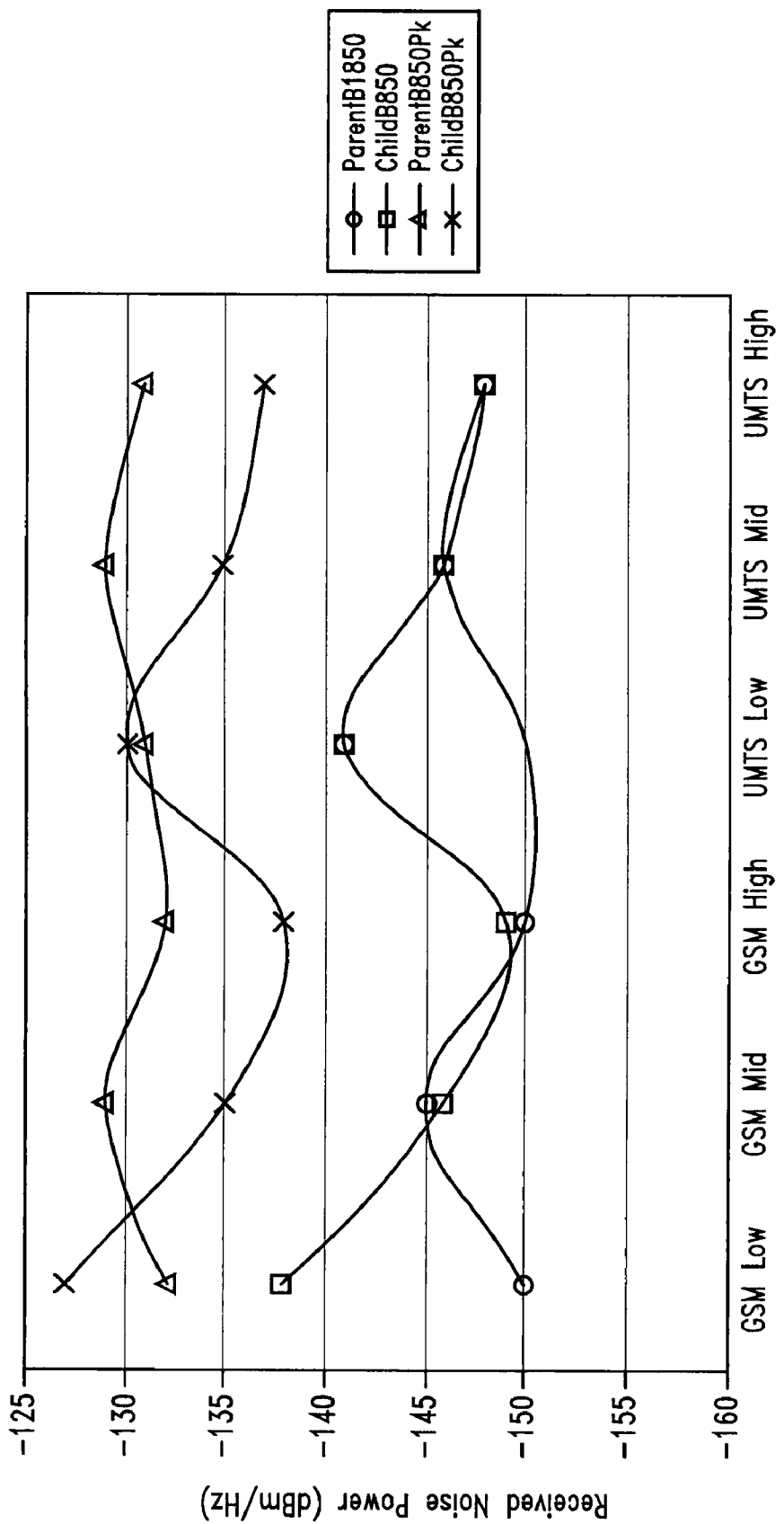
FIG. 24 is a graph illustrating received noise power comparison for a second parent device and a second child device in the 850 MHz band.
Figure 25:
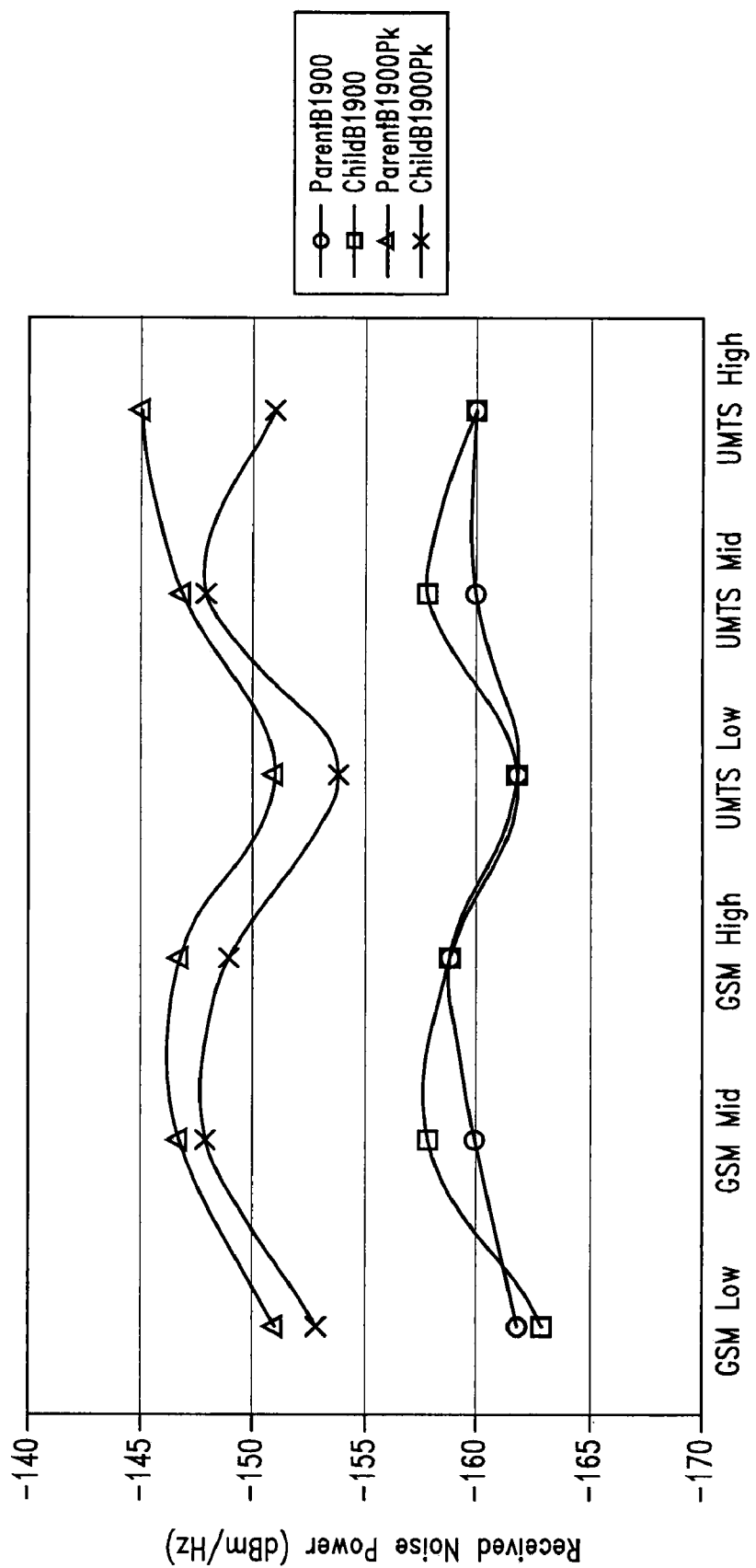
FIG. 25 is a graph illustrating received noise power comparison for a second parent device and a second child device in the 1900 MHz band.

The data from Parent "B"/Child "1B" has been graphically summarized for analysis in FIG. 24 for the 850 MHz band and in FIG. 25 for the 1900 MHz band.

Analysis, Parent B vs. Child 1B, 850 MHz Band

Measurement results for the 850 MHz band have been summarized for Parent "B", Child "1B" in the tables of FIGS. 20 and 21 and graphically summarized in FIG. 24.

Both the Parent "B" and the Child "1B" platforms display minimal correlation between CTIA TIS and noise signature results, and minimal correlation to each other. GSM and UMTS CTIA TIS are also poorly correlated, potentially due to noise differences between the samples used for each test.

Parent "B" displays and unusually high PAR of >15 dB across the entire band, which indicates the presence of time-variant, high-amplitude noise peaks that measure about 5 to 10 dB above the Gaussian peak noise level. Child "1B", on the other hand, displays an almost constant PAR of 10 dB across the entire band, indicating noise with a Gaussian distribution. However, this Gaussian-like noise has an unusually high amplitude at the low end of the band, where the device also displayed a lower CTIA TIS performance.

Analysis, Parent B vs. Child 1B, 1900 MHz Band

Measurement results for the 1900 MHz band have been summarized for Parent "B", Child "1B" in the tables of FIGS. 22 and 23 and graphically summarized in FIG. 24.

On this band, there is reasonably good agreement between CTIA TIS and the DUT noise signature. In addition, the Parent "B" and Child "1B" display excellent correlation in noise signature results. The PAR is an almost constant 10 dB, indicating a Gaussian noise distribution across the low and mid portion of the band for the Parent "1B", and across the entire band for the Child "1B". At the high end of the band, the Parent displays a PAR of 15 dB, indicating the presence of time-variant noise pulses about 5 dB above the Gaussian level.

Comparison of Parent/Child Performance, Case #3

The third mobile computing platforms tested were also selected for minimal variables. In this case, the Parent and Child are identical with the exception of the graphics card. Two samples of each platform were provided by the vendor for noise signature testing. Only the Parent was evaluated using the CTIA TIS test methodology.

Test Results

Test results for the Parent "C" and Child "1C" are presented the tables of FIGS. 26-29. The table of FIG. 26 illustrates the test results for the Parent "C" in the 850 MHz band. The table of FIG. 27 illustrates the test results for the Child "1C" in the 850 MHz band. The table of FIG. 28 illustrates the test results for the Parent "C" in the 1900 MHz band. The table of FIG. 29 illustrates the test results for the Child "1C" in the 1900 MHz band.

Analysis

Figure 30:
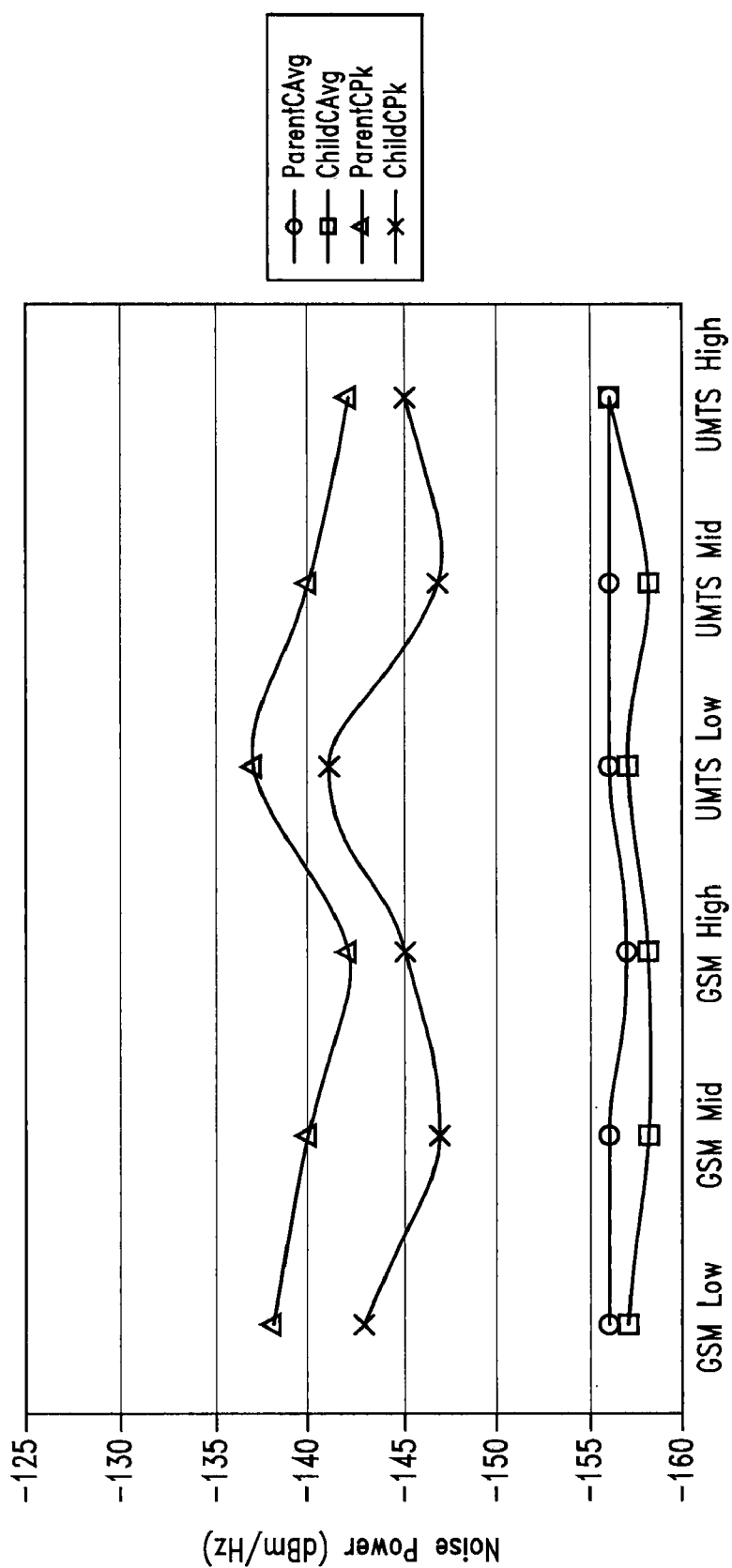
FIG. 30 is a graph illustrating received noise power comparison for a third parent device and a third child device in the 850 MHz band.
Figure 31:
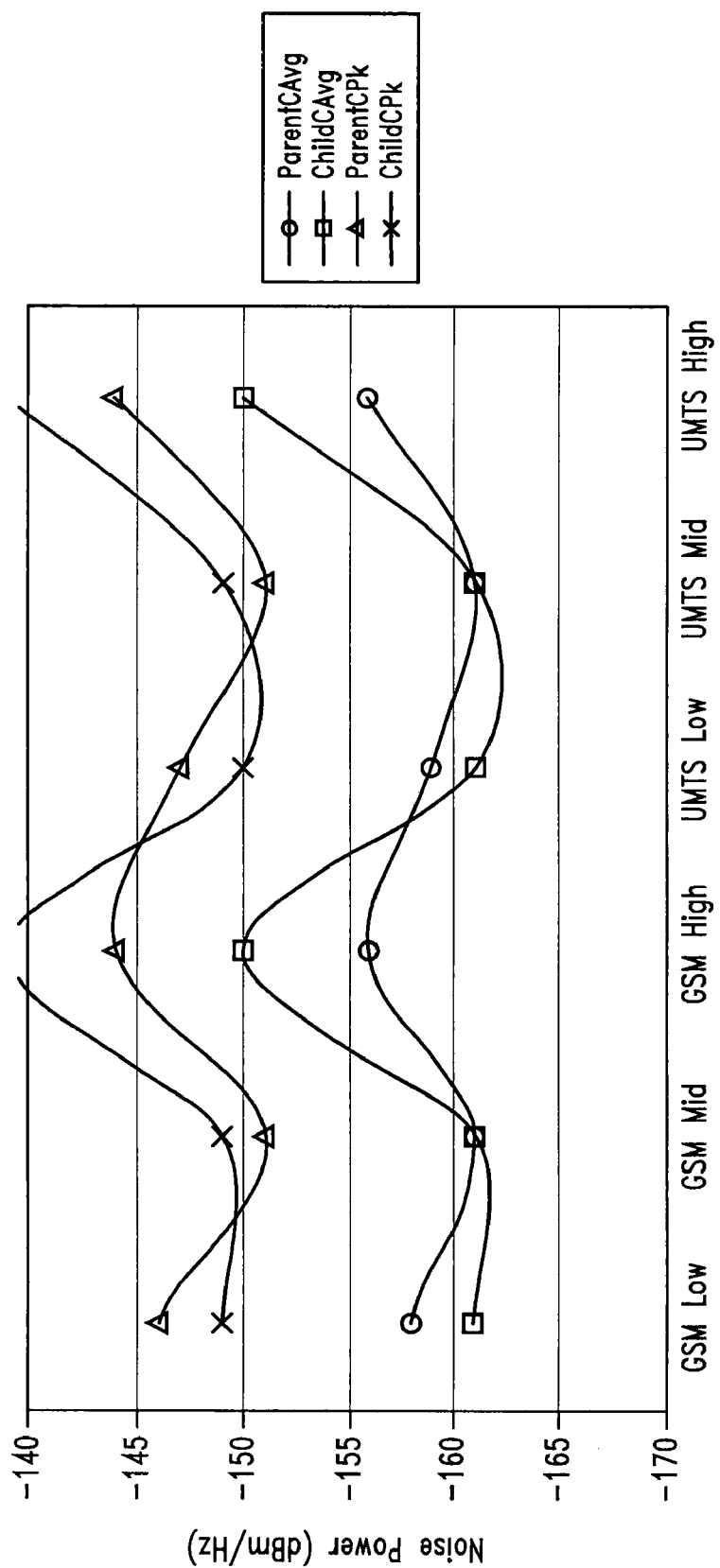
FIG. 31 is a graph illustrating received noise power comparison for a third parent device and a third child device in the 1900 MHz band.

The data from Parent "C"/Child "1C" has been graphically summarized for analysis in FIG. 30 for the 850 MHz band and in FIG. 31 the 1900 MHz band.

Analysis, Parent C vs. Child 1C, 850 MHz Band

Measurement results for the 850 MHz band have been summarized for Parent "C", Child "1C" in the tables of FIGS. 26 and 27 and graphically summarized in FIG. 30.

In this example, the Parent "C" and Child "1C" display excellent correlation in terms of average noise power, and reasonably good correlation with respect to peak noise power. However, the data also suggests that time-variant noise peaks are present throughout the band, with the center of the band displaying the lowest incidence of transient noise power for the Child "1C" platform and the low end of the band displaying the lowest incidence of transient noise power in the Parent platform. Both the Parent "C" and the Child "1C" display a PAR >15 dB at the band edges, indicating time-variant noise pulses about 5 dB above the Gaussian level. Correlation to CTIA TIS results is very good, as the data indicates a low overall noise level on this band, and the CTIA TIS performance reflects this.

Analysis, Parent C vs. Child 1C, 1900 MHz Band

Measurement results for the 1900 MHz band have been summarized for Parent "C", Child "1C" in the tables of FIGS. 28 and 29 and graphically summarized in FIG. 31.

On this band, correlation between the Parent "C" and Child "1C" is reasonably good, however, the Child "1C" consistently displays higher noise levels at the high end of each band than what was measured in the Parent "C". Both the Parent "C" and the Child "1C" display a PAR in the vicinity of 12 dB, indicating that most of the noise is Gaussian in nature. Correlation between the Parent "C" and CTIA TIS data is reasonably good. The data suggests that a very high noise level is present at the high end of the band, but the noise is primarily Gaussian in nature.

Comparison of Parent/Child Performance, Case #4

The fourth mobile computing platforms tested were also selected for minimal variables. In this case, the Parent "D" and Child "1D" are identical with the exception of minor cosmetic differences. Two samples of each platform were provided by the vendor for testing noise signature testing, however, only the Parent device was evaluated using the CTIA TIS methodology.

Test Results

Test results for the Parent "D" and Child "1D" are presented the tables of FIGS. 32-35. The table of FIG. 32 illustrates the test results for the Parent "D" in the 850 MHz band. The table of FIG. 33 illustrates the test results for the Child "1D" in the 850 MHz band. The table of FIG. 34 illustrates the test results for the Parent "D" in the 1900 MHz band. The table of FIG. 35 illustrates the test results for the Child "1D" in the 1900 MHz band.

Analysis

Figure 36:
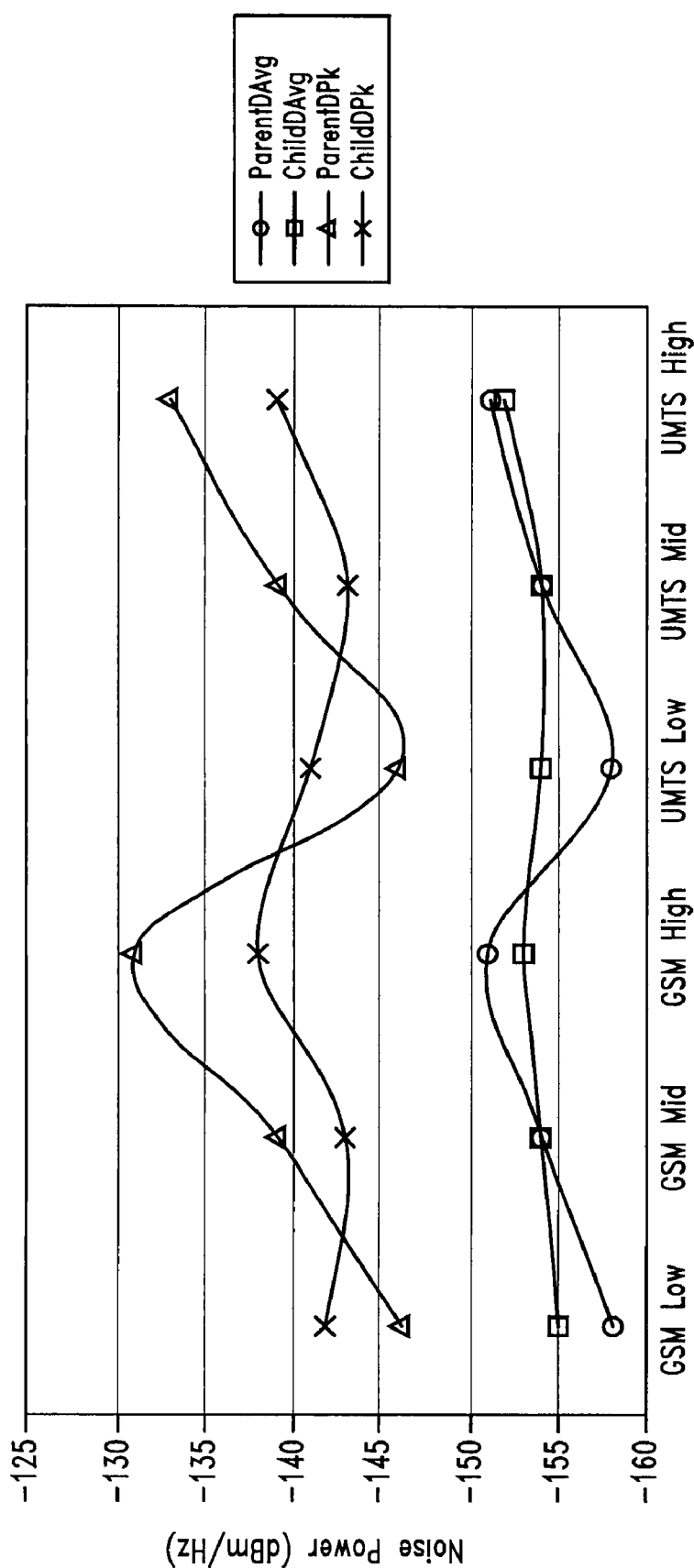
FIG. 36 is a graph illustrating received noise power comparison for a fourth parent device and a fourth child device in the 850 MHz band.
Figure 37:
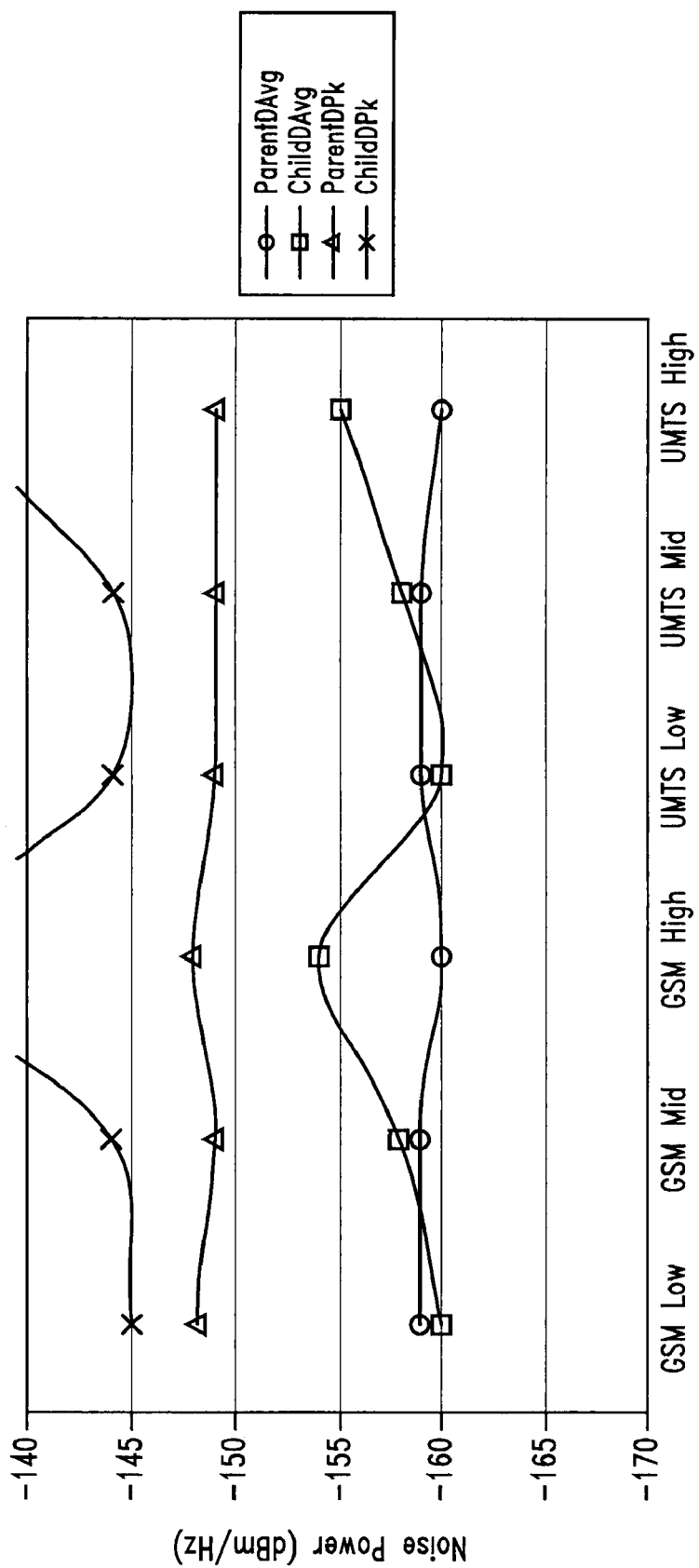
FIG. 37 is a graph illustrating received noise power comparison for a fourth parent device and a fourth child device in the 1900 MHz band.

The data from Parent "D"/Child "1D" has been graphically summarized for analysis in FIG. 36 for the 850 MHz band and in FIG. 37 for the 1900 MHz band.

Parent D vs. Child 1D, 850 MHz Band

Measurement results for the 850 MHz band have been summarized for Parent "D", Child "1D" in the tables of FIGS. 32 and 33 and graphically summarized in FIG. 36.

The Parent "D" and Child "1D" devices show reasonable correlation in terms of average noise power, but the correlation with respect to peak power is poor. In this band, the Parent "D" displays an unusually high noise level at the high end of the band, with a PAR approaching 20 dB. This high PAR indicates time-variant noise bursts about 10 dB above the Gaussian noise level. Elsewhere, both the Parent "D" and Child "1D" display a PAR in the 10-12 dB range, indicating the presence of primarily Gaussian noise. Interestingly, these results are exactly the opposite of what was measured using the CTIA TIS methodology. TIS shows impairment at the low and mid portion of the 850 MHz band for both technologies, with GSM the most affected.

Analysis, Parent D vs. Child 1D, 1900 MHz Band

Measurement results for the 1900 MHz band have been summarized for Parent "D", Child "1D" in the tables of FIGS. 34 and 35 and graphically summarized in FIG. 37.

On this band, the anomaly that was observed as an unusually high noise level at one end of the band reversed from what was observed in the 850 MHz band between the Parent "D" to the Child "1D". The Parent "D" displays a relatively low noise floor, with a PAR of about 12 dB, indicating a prominence of noise with a Gaussian distribution and minimal high-amplitude, time variant noise peaks. The Child "1D", however, displays poor correlation with the Parent "D", and a very high PAR (>15 dB), indicating a high incidence of high-amplitude, time-variant noise peaks about 5 dB above the Gaussian noise. When compared to CTIA TIS results, the noise signature does not correlate well. CTIA TIS shows an impairment at the low end of the band for both airlink technologies, yet the noise signature data indicates almost no difference between the low, mid and high portion of the band.

Measurement Uncertainty

There are several components to measurement uncertainty in the measurement of noise signature. These uncertainty components are listed below in descending order of relevance:

Compromised shielding integrity due to inclusion of a coaxial cable to the computing platform's internal antenna connector;

Differences in system activity on platform under test (e.g. buss, graphics, display, hard drive, memory and CPU usage);

Re-radiation from cabling within the shielded chamber;

Compromised noise measurement at band edges due to wide resolution bandwidth (e.g., strong interferer just outside the band can effectively noise-limit the associated in-band measurement, even though actual in-band power from this interferer is low);

Limited measurement resolution in averaging mode; and

Inadequate shielding of spectrum analyzer against strong nearby signals in the 850 and/or 1900 MHz downlink bands These contributions to measurement uncertainty as well as defining a means by which uncertainty can be determined for a given laboratory configuration will be the subject of future study.

In the future, noise thresholds will be developed for both the 850 and the 1900 MHz band. These noise thresholds will greatly simplify the analysis of noise signature data and provide guidance to design engineers to minimize the potential for system-generated noise to become a factor in WWAN modem performance.

CONCLUSION

In this paper, a methodology for evaluating noise signature has been presented, and the principles of this procedure have been applied to actual devices. Four Parent/Child mobile computing platforms from different manufacturers were evaluated and the results compared with "classical" TIS measurements. During the course of this evaluation, varying degrees of correlation were noted between the Parent and the Child device, as well as between CTIA TIS and noise signature.

However, the data collected during this project indicates that while exact correlation with "formal TIS" measurements may not be possible, it should be possible to define an antenna noise power emission mask that would greatly reduce the uncertainty that a given computing platform will fail TIS.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Accordingly, the invention is not limited except as by the appended claims.

The invention claimed is:

1. A method for determining electromagnetic compatibility in a wireless device comprising:
    performing a plurality of electromagnetic compatibility tests on a parent device;
    saving test results for the parent device;
    performing a selected portion of the plurality of tests, less than all the plurality of tests, on a device under test (DUT), the DUT having selected design characteristics matching corresponding characteristics of the parent device;
    comparing the test results of the DUT with the test results for the parent device; and
    based on the comparison of the test results, determining if the DUT is sufficiently similar to the parent device that performing the plurality of electromagnetic compatibility tests on the DUT is unnecessary.

2. The method of claim 1 wherein the plurality of tests performed on the parent device comprises a total radiated power (TRP) test, a total isotropic sensitivity (TIS) test, and a noise signature test.

3. The method of claim 1 wherein the parent device is a notebook computer with internal radio frequency (RF) wireless circuitry and the DUT is also a notebook computer with internal RF wireless circuitry designed with the same RF wireless circuitry as the parent device and other portions of the DUT are designed with circuitry different from the circuitry of the parent device.

4. The method of claim 1 wherein the DUT has identical wireless radio frequency circuitry and antenna design as the parent device.

5. The method of claim 1 wherein the selected portion of the plurality of tests comprises a noise signature test and comparing test results comprises comparing the noise signature of the parent device with the noise signature of the DUT.

6. The method of claim 5 wherein the noise signature test comprises a peak noise signature and an average noise signature.

7. The method of claim 1 wherein the plurality of tests performed on the parent device are performed while the parent device is in a shielded chamber, and the selected portion of the plurality of tests performed on the DUT are performed while the DUT is in a shielded chamber.

8. The method of claim 1 for use with a DUT having an internal antenna connection, the method further comprising disconnecting the internal antenna connection and connecting the DUT antenna connection to a spectrum analyzer to thereby measure a noise signature of the DUT.

9. The method of claim 1 wherein the selected portion of the plurality of tests performed on the DUT are performed at selected frequency bands.

10. The method of claim 9 wherein the selected portion of the plurality of tests performed on the DUT are performed at the 850 megahertz (MHz) and 1900 MHz frequency bands.

11. The method of claim 9 wherein the selected portion of the plurality of tests performed on the DUT are performed at selected frequencies within the frequency bands.

12. The method of claim 1 wherein the selected portion of the plurality of tests performed on the DUT are performed using predetermined frequencies based on unique bandwidth characteristics of GSM (Global System for Mobile Communications) airlink interface protocols.

13. The method of claim 1 wherein the selected portion of the plurality of tests performed on the DUT are performed using frequencies based on unique bandwidth characteristics of UMTS (Universal Mobile Telecommunications System) airlink interface protocols.

14. A system for determining electromagnetic compatibility in a wireless device comprising:
    a shielded chamber sized to receive a parent device and to provide radio frequency shielding of the parent device during testing;
    a processor configured to perform a plurality of electromagnetic compatibility tests on the parent device in the shielded chamber; and
    a storage device configured to save test results for the parent device;
    the shielded chamber being further configured to receive a device under test (DUT) and to provide radio frequency shielding of the DUT during testing, the DUT having selected design characteristics matching corresponding characteristics of the parent device;
    the processor being further configured to perform a selected portion of the plurality of electromagnetic compatibility tests, less than the plurality of electromagnetic compatibility tests, on the DUT in the shielded chamber; and
    the storage device being further configured to save test results for the DUT;

the processor being further configured to compare test results of the parent device and the test results of the DUT and to generate data related to the comparison.

15. The system of claim 14, further comprising a spectrum analyzer configured to perform at least a portion of the plurality of electromagnetic compatibility tests on the parent device and at least a portion of the portion of plurality of electromagnetic compatibility tests on the DUT.

16. The system of claim 15 wherein the processor is configured to provide operational control of the spectrum analyzer.

17. The system of claim 14, further comprising wherein the processor is a part of a spectrum analyzer.

18. The system of claim 14 wherein the selected portion of the plurality of tests performed by the processor comprises a noise signature test and the processor compares the noise signature of the parent device with the noise signature of the DUT.

19. The system of claim 18 wherein the noise signature test comprises a peak noise signature and an average noise signature.

20. The system of claim 14 wherein the processor performs the selected portion of the plurality of tests on the DUT at selected frequency bands.

21. The system of claim 20 wherein the processor performs the selected portion of the plurality of tests on the DUT at the 850 megahertz (MHz) and 1900 MHz frequency bands.

22. The system of claim 20 wherein the processor performs the selected portion of the plurality of tests on the DUT at selected frequencies within the selected frequency bands.

23. The system of claim 14 wherein the processor performs the selected portion of the plurality of tests on the DUT using predetermined frequencies based on unique bandwidth characteristics of GSM airlink interface protocols.

24. The system of claim 14 wherein the processor performs the selected portion of the plurality of tests on the DUT using predetermined frequencies based on unique bandwidth characteristics of UMTS airlink interface protocols.

* * * * *